US011171624B2

(12) United States Patent
Haroun et al.

(10) Patent No.: US 11,171,624 B2
(45) Date of Patent: Nov. 9, 2021

(54) VOLTAGE SENSOR DEVICE BASED ON A TUNABLE BULK ACOUSTIC WAVE (BAW) RESONATOR

(71) Applicant: TEXAS INSTRUMENTS INCORPORATED, Dallas, TX (US)

(72) Inventors: Baher Haroun, Allen, TX (US); Bichoy Bahr, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 13 days.

(21) Appl. No.: 16/232,259

(22) Filed: Dec. 26, 2018

(65) Prior Publication Data

US 2020/0212872 A1 Jul. 2, 2020

(51) Int. Cl.

*G01R 31/00* (2006.01)
*H03H 9/02* (2006.01)
*H03H 9/17* (2006.01)

(52) U.S. Cl.

CPC .... *H03H 9/02015* (2013.01); *H03H 9/02047* (2013.01); *H03H 9/17* (2013.01); *H03H 2009/02165* (2013.01)

(58) Field of Classification Search

USPC ........................ 324/76.41, 72.5, 118; 327/42
See application file for complete search history.

(56) References Cited

U.S. PATENT DOCUMENTS

| | | | | |
|---|---|---|---|---|
| 4,059,804 A * | 11/1977 | Agnus | G01R 23/005 | 327/42 |
| 4,553,099 A * | 11/1985 | Kasahara | G01R 15/165 | 324/118 |
| 2006/0125465 A1* | 6/2006 | Xiang | G01Q 10/065 | 324/72.5 |
| 2017/0070150 A1* | 3/2017 | Kim | H02M 3/285 | |

* cited by examiner

*Primary Examiner* — Vincent Q Nguyen
(74) *Attorney, Agent, or Firm* — Ray A. King; Charles A. Brill; Frank D. Cimino

(57) ABSTRACT

A voltage sensor device includes an oscillator unit, the oscillator unit having a tunable bulk acoustic wave (BAW) resonator device and an oscillator core. The voltage sensor device also includes a frequency analyzer configured to obtain frequency measurements for the oscillator unit and to determine a voltage sense value based on a comparison of at least some of the obtained frequency measurements. The voltage sensor device also includes an output interface configured to store or output voltage sense values determined by the frequency analyzer.

12 Claims, 16 Drawing Sheets

VOLTAGE SENSOR DEVICE BASED ON A TUNABLE BULK ACOUSTIC WAVE (BAW) RESONATOR

BACKGROUND

Power supplies and power converters are used in a variety of electronic systems. Available electrical power is generally transmitted over long distances as an alternative-current (AC) signal. The AC signal is divided and metered as desired for each business or home location, and is often converted to one or more direct-current (DC) signals for use with individual electronic devices or components. With alternative energy options (e.g., solar energy or wind turbines), the energy is accumulated using batteries or other storage devices, and DC converters are used to supply individual electronic devices or components. With the proliferation of electrical devices, there is a need to monitor the operation of electrical devices and/or the power supply for electrical devices. Such monitoring may involve collecting AC or DC voltage measurements.

When collecting measurements related to a high-voltage AC or DC signal (e.g., on the order of 1000V or more), the risk of physical harm, damage to the equipment carrying the high-voltage signal and/or damage to test equipment or sensors increases. Thus, high-voltage signal sensing is often complicated by such risks. Also, sensing techniques that are effective at lower voltages are no longer effective at high voltages and/or involve more expensive components. Efforts to improve high-voltage signal sensing technology are ongoing.

SUMMARY

In accordance with at least one example of the disclosure, a voltage sensor device comprises an oscillator unit, the oscillator unit having a tunable bulk acoustic wave (BAW) resonator device and an oscillator core. The voltage sensor device also comprises a frequency analyzer configured to obtain frequency measurements for the oscillator unit and to determine a voltage sense value based on a comparison of at least some of the obtained frequency measurements. The voltage sensor device an output interface configured to store or output voltage sense values determined by the frequency analyzer.

In accordance with at least one example of the disclosure, a voltage sensor device fabrication method comprises obtaining an oscillator unit, the oscillator unit having a tunable BAW resonator device and an oscillator core. The fabrication method also comprises coupling a frequency analyzer to the oscillator unit, wherein the frequency analyzer is configured to obtain frequency measurements for each oscillator unit and to determine a voltage sense value based on a comparison of at least some of the obtained frequency measurements. The fabrication method also comprises providing an output interface configured to store or output voltage sense values determined by the frequency analyzer.

BRIEF DESCRIPTION OF THE DRAWINGS

For a detailed description of various examples, reference will now be made to the accompanying drawings in which.

DETAILED DESCRIPTION

Figure 1A:
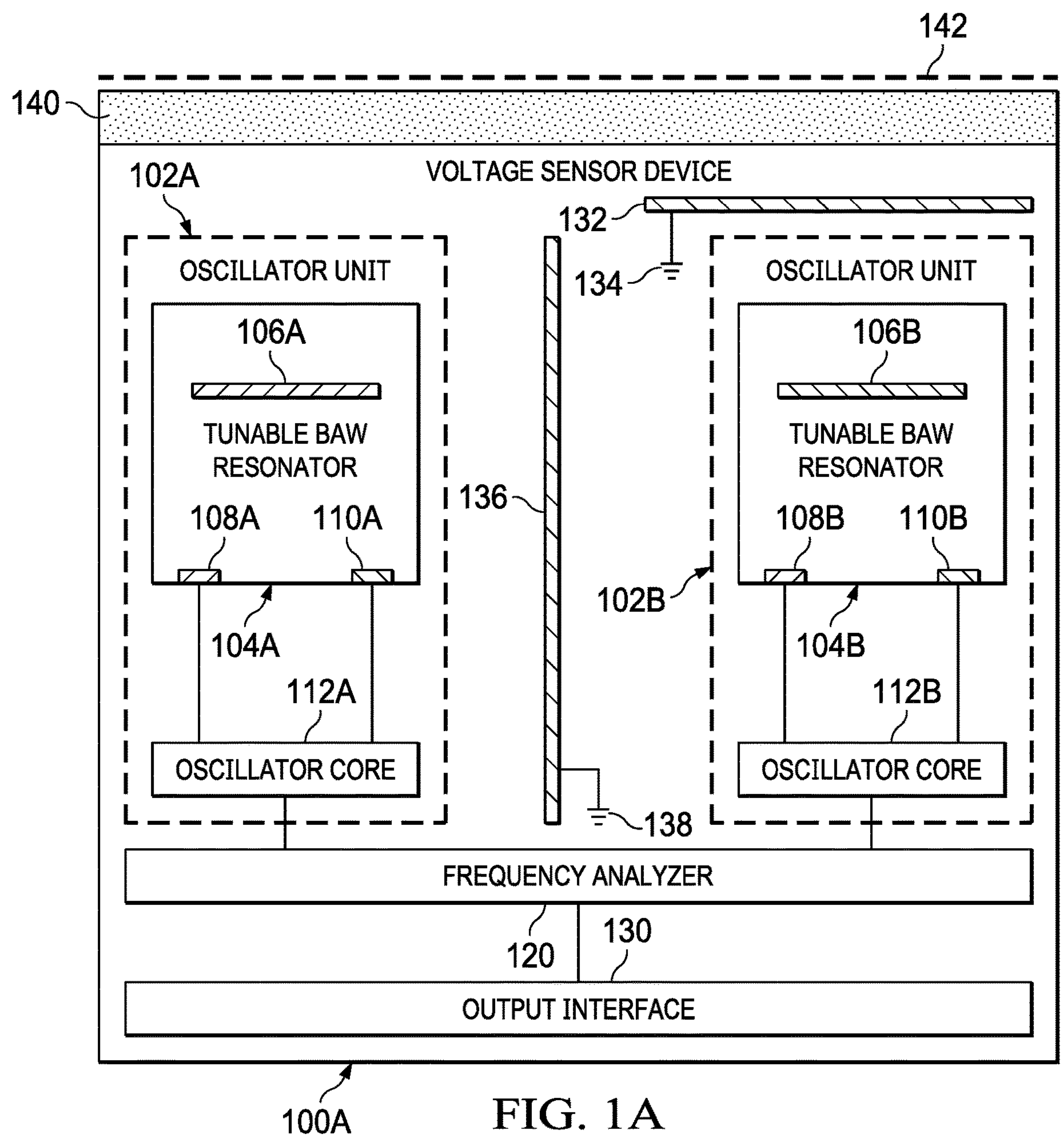
FIGS. 1A-1B show voltage sensor devices in accordance with various examples.

The disclosed examples are directed to voltage sensor devices based on tunable bulk acoustic wave (BAW) resonators and related systems, methods, and options. In various examples, a voltage sensor device includes at least one oscillator unit, each oscillator unit having a tunable BAW resonator device and an oscillator core. The voltage sensor device also includes a frequency analyzer configured to obtain frequency measurements for each oscillator unit and to determine a voltage sense value based on a comparison of at least some of the obtained frequency measurements. The voltage sensor device also includes an output interface configured to store or output voltage sense values determined by the frequency analyzer. As used herein, a "tunable BAW resonator" refers to a BAW resonator that exhibits a predictable shift in frequency in response to different voltage levels applied to one or more electrodes or electro-active layers of the BAW resonator. In different examples, the number of electrodes and/or electro-active layers in a tunable BAW resonator varies. Without limitation, tunable BAW resonators with three electrodes and respective terminals are sometimes referred to herein.

In some examples, a tunable BAW resonator device for each oscillator unit includes a bottom electrode and two top electrodes (e.g., a three-terminal or three-electrode BAW resonator device). In other examples, a tunable BAW resonator device only has two terminals or electrodes. In a sensing scenario involving a three-terminal BAW resonator, the two top electrodes of the three-terminal BAW resonator device couple to differential oscillator terminals (e.g., pads or pins to receive differential oscillator signals V+ and V− from an oscillator core). Meanwhile, the bottom electrode of the three-terminal BAW resonator device operates as a capacitor terminal that acquires a voltage depending in part on the voltage signal carried by a nearby conductive element (no direct contact occurs between the bottom electrode and the nearby conductive element). The voltage acquired by the bottom electrode also depends on the dielectric constants and thicknesses of materials between the bottom electrode and the conductive element. Accordingly, in different embodiments, the dielectric layers between the bottom electrode of a three-terminal BAW resonator device and a conductive element are selected to provide sensitivity to a particular voltage range (e.g., 500-1000V, 1000-2000V, 2000-4000V, and so on). Some or all dielectric layers can be provided with the voltage sensor device. Alternatively, in some scenarios, entities installing a voltage sensor device add one or more dielectric layers.

In various examples, voltage sensor devices include a sensor attachment interface to facilitate attaching a voltage sensor device on or near a conductive element. In some examples, the sensor attachment interface includes a conductive sensing surface configured to couple directly to a conductive element to be monitored. With the conductive sensing surface, a higher degree of control and accuracy is possible for voltage sensing. In other examples, a sensor attachment interface omits a conductive sensing surface, but includes non-conductive features to help ensure dielectric layers between the conductive element and a bottom electrode have expected values and thicknesses. Such non-conductive features can vary depending on the shape of the conductive element to be monitored and the desired voltage range sensitivity.

Various options are possible to adjust the sensitivity or voltage range of a voltage sensor device based on one or more tunable BAW resonators. For example, adjusting the size of a tunable BAW resonator (e.g., at least the bottom electrode) will affect the sensitivity or voltage range of a respective voltage sensor device. Also, the material and thickness of any layers between a bottom electrode and a conductive element to be monitored will affect the sensitivity or voltage range of a respective voltage sensor device. In different examples, at least some of these layers are part of the voltage sensor device. Also, some dielectric layers are intentionally or unintentionally added between a voltage sensor device and a conductive element when installation of a voltage sensor device is performed. In either case, different voltage sensor device designs are possible to account for different voltage range sensitivity and/or installment options. Testing and selection of an appropriate voltage sensor device design for different sensing scenarios is possible.

In different examples, AC or DC voltage is sensed by the voltage sensor device. For AC voltage sensing, the BAW resonator frequency (e.g., 2.52 GHz) is much higher than the AC voltage frequency (e.g., 60 Hz). In this example, the BAW completes 42 million cycles during 1 AC cycle. Accordingly, the AC voltage is sensed as a static voltage by the voltage sensor device. As desired, an AC voltage cycle is easily sampled by monitoring frequency shifts in the BAW resonator as a function of time.

In a sensing scenario involving a three-electrode BAW resonator device, the bottom electrode of the three-terminal BAW resonator device acquires a voltage based on the voltage carried by a nearby conductive element, resulting in the center frequency of the three-terminal BAW resonator device being shifted. Thus, by comparing frequency measurements for an oscillator unit when its three-terminal BAW resonator has a grounded bottom electrode versus a floating bottom electrode, an estimate of the voltage carried by the conductive element is possible. In other examples, the frequency measurements for different oscillator units are compared, where one oscillator unit has its three-terminal BAW resonator with a floating bottom electrode while the other oscillator unit has its three-terminal BAW resonator with a grounded or shielded bottom electrode. In some examples, oscillator units are manufactured with BAW resonator devices on the same die, or from the same wafer, so that the BAW resonator devices have closely matching characteristics. Thus, drifts in temperature or other environmental changes will affect matching BAW resonator devices in the same way. In some examples, these comparison options are combined such that single oscillator unit comparisons and multiple oscillator unit comparisons are used to estimate the voltage carried by a conductive element.

The output of a voltage sensor device based on one or more tunable BAW resonators can be used in different ways. In some electrical system examples, the output of a voltage sensor device is displayed to an operator (e.g., an estimated voltage value is displayed via a computer monitor, printer, speaker, or other device). In other electrical system examples, the output of a voltage sensor device is used to regulate ongoing operations (e.g., to increase or decrease power or another parameter of an electrical system). In other electrical system examples, the output of a voltage sensor device is used to identify emergencies or malfunctions.

In different examples, the output of a voltage sensor device varies. In some examples, a voltage sensor device provides a direct estimate of a voltage signal on a nearby conductor (e.g., the voltage sensor device outputs a sense value of 1000V if the voltage signal on a nearby conductor is 1000V). In some examples, a voltage sensor device provides an indirect estimate of a voltage signal on a nearby conductor (e.g., the voltage sensor device outputs a sense value of 1V if the voltage signal on a nearby conductor is 1000V). In some examples, a voltage sensor device provides an estimated change in a voltage signal on a nearby conductor (e.g., the voltage sensor device outputs a sense value of +100V if the voltage signal on a nearby conductor is increased from 900V to 1000V). In some examples, a voltage sensor device provides an indirect estimated change in a voltage signal on a nearby conductor (e.g., the voltage sensor device outputs a sense value of +0.1 if the voltage signal on a nearby conductor is increased from 900V to 1000V). In some examples, a voltage sensor device provides different types of sense values depending on the electrical system (i.e., how the voltage sensor is used). To provide a better understanding, various voltage sensor device options, scenarios, and details are described using the figures as follows.

Figure 1B:
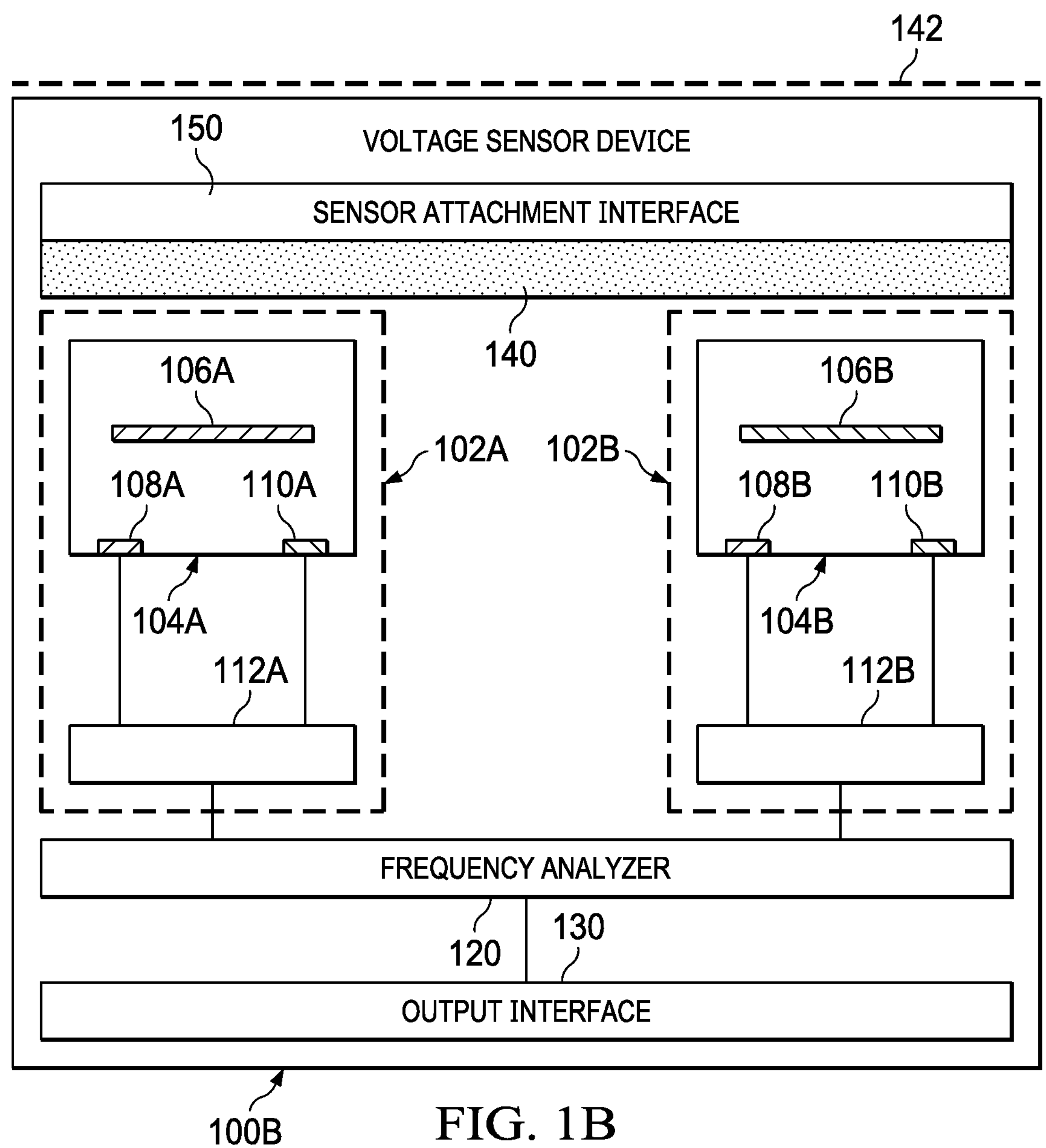

FIGS. 1A-1B show voltage sensor devices in accordance with various examples. In FIG. 1A, the voltage sensor device 100A comprises first and second oscillator units 102A and 102B. The first oscillator unit 102A includes a tunable BAW resonator device 104A with a bottom electrode 106A, a first top electrode 108A, and a second top electrode 110A. Similarly, the second oscillator unit 102B includes a tunable BAW resonator device 104B with a bottom electrode 106B, a first top electrode 108A, and a second top electrode 110B. Each of the tunable BAW resonator device 104A and 104B couples to a respective oscillator core 112A and 112B. More specifically, the tunable BAW resonator device 104A has its top electrodes 108A and 110A coupled to the oscillator core 112A. Meanwhile, the tunable BAW resonator device 104B has its top electrodes 108B and 110B coupled to the oscillator core 112B. The oscillator cores 112A and 112B couple to a frequency analyzer 120. The frequency analyzer 120 couples to an output interface 130.

As shown in FIG. 1A, the voltage sensor device 100A includes shields 132 and 136 around the tunable BAW resonator device 104B. The shields 132 and 136 correspond to conductive material connected to respective ground nodes 134 and 138. With the shields 132 and 136 grounded as shown, the operation of the tunable BAW resonator device 104B is not significantly affected by placement of the voltage sensor device 100A near a sensing surface 142. Thus, the oscillator unit 104B will have a frequency that corresponds to a default frequency for the tunable BAW resonator device 104B. In contrast, the operation of the tunable BAW resonator device 104A is affected by placement of the voltage sensor device 100A near a sensing surface 142. Thus, the oscillator unit 104A will have a frequency that corresponds to a biased frequency for the tunable BAW resonator device 104A. The biased frequency is a function of a voltage acquired by the bottom electrode 106A due to a voltage carried by a conductive element (the conductive element is represented by the sensing surface 142) and any dielectric materials (e.g., including select dielectric layers 140) between the sensing surface 142 and the bottom electrode 106A of the tunable BAW resonator device 104A. Thus, if the dielectric materials and layer thickness between the sensing surface 142 and the bottom electrode 106A are known, the biased frequency can be used to estimate the voltage acquired by the bottom electrode 106A and the voltage signal carried by a conductive element near the voltage sensor device 100A.

In one example, the frequency analyzer 120 obtains frequency measurements by comparing the biased frequency from the oscillator unit 104A with the default frequency of the oscillator unit 104B. In another example, the frequency analyzer 120 obtains frequency measurements by comparing the biased frequency from the oscillator unit 104A and the default frequency of the oscillator unit 104B with a reference frequency (e.g., from a third oscillator unit with a crystal oscillator). In other examples, the frequency analyzer 120 compares the biased frequency from the oscillator unit 104A with a predetermined frequency of the oscillator unit 104A. The frequency analyzer 120 then determines a voltage sense value (e.g., the bias voltage acquired by the bottom electrode 106A and/or an estimated voltage of a DC signal on a nearby conductor) based on at least one frequency measurement.

In the example of FIG. 1A (multiple tunable BAW resonator devices and one shielded), the bottom electrode 106A of tunable BAW resonator device 104A and the bottom electrode 106B of the tunable BAW resonator device 104B are "floating". In other examples, one or more of the shields 132 and 136 are omitted. In one shieldless example, voltage sensing is performed by floating the bottom electrode 106A of tunable BAW resonator device 104A and grounding the bottom electrode 106B of the tunable BAW resonator device 104B. In another shieldless example, only the tunable BAW resonator device 104A is used (e.g., the oscillator unit 104B is omitted). In this example, voltage sensing is performed by floating the bottom electrode 106A of tunable BAW resonator device 104A and comparing a biased frequency for the oscillator unit 104A with a predetermined frequency for the oscillator unit 104A. In one example, the predetermined frequency for the oscillator unit 104A is obtained by temporarily grounding the bottom electrode 106A of tunable BAW resonator device 104A (before or after a biased frequency measurement is obtained by the frequency analyzer 120) and is stored by the frequency analyzer 120 for comparison with a biased frequency for the oscillator unit 104A. In another example, the predetermined frequency is based on calculations and/or testing, and is stored by the frequency analyzer 120 for comparison with a biased frequency for the oscillator unit 104A.

Regardless of the particular frequency measurements obtained by the frequency analyzer 120, these frequency measurements are used to determine voltage sense values (e.g., the bias voltage acquired by the bottom electrode 106A and/or an estimated voltage of a DC signal on a nearby conductor) resulting from a voltage signal on a nearby conductive element represented by the sensing surface 142. The voltage sense values determined by the frequency analyzer 120 are stored by the output interface 130 for later access and/or are conveyed by the output interface 130 to monitor/response components of an electrical system as described for FIGS. 2A and 2B.

FIG. 1B shows another voltage sensor device 100B. As shown, the voltage sensor device 100B includes the oscillator units 104A and 104B, the frequency analyzer 120, and the output interface 130 discussed in FIG. 1A. The voltage sensor device 100B of FIG. 1B varies from the voltage sensor device 100A of FIG. 1A at least in part because the voltage sensor device 100B includes the select dielectric layers 140 that are represented in FIG. 1 as being external to the voltage sensor device 100A. Also, the voltage sensor device 100B includes a sensor attachment interface 150 that facilitates positioning the voltage sensor device 100B near a conductive element to be monitored (represented by the sensing interface 142). In some examples, the sensor attachment interface 150 includes a conductive surface that connects directly to a conductive element to be monitored. Additionally or alternatively, the sensor attachment interface 150 includes splice components to insert voltage sensor device 100B along a conductive element to be monitored. Additionally or alternatively, the sensor attachment interface 150 includes non-conductive elements (e.g., clips, adhesives, etc.).

In various examples, components are added to or removed from the voltage sensor device 100B. In one example, shield 132 and/or shield 136 is added to the voltage sensor device 100B (on one or more sides of the tunable BAW resonator device 104B. In another example, the oscillator unit 104B is omitted. The operations of the frequency analyzer 120 are as described in FIG. 1A, where different frequency analysis options are available (e.g., comparison of a biased frequency and a default/predetermined frequency for one oscillator unit, comparison of a biased frequency and a default/predetermined frequency for different oscillator units, use of a third reference oscillator, etc.). With the arrangement of voltage sensor device 100B, the select dielectric layers 140 and/or the sensor attachment interface 150 are provided with the voltage sensor device 100B. It should be appreciated that the selected dielectric layers 140 do not represent every material between the bottom electrode (e.g., electrode 106A) of a tunable BAW resonator device and a sensing surface 142. Rather, the select dielectric layers 140 correspond to one or more layers of materials with respective thicknesses and dielectric constants that are included in a voltage sensing scenario (with voltage devices 100A or 100B) to target a desired sensitivity or voltage range.

In FIGS. 1A and 1B, the voltage sensor devices 100A and 100B are described as having tunable BAW resonator devices 104A and 104B with three terminals each (e.g., device 104A has terminals 106A, 108A, and 110A). In other examples, voltage sensor devices such as voltage sensor devices 100A and 100B employ tunable BAW resonator devices with two terminals, four terminals, or other numbers of terminals. As long as the center frequency of a tunable BAW resonator device changes in a predicable manner based on the position of at least one BAW resonator electrode and/or electro-active layer relative to a voltage carried by a nearby conductive element, the number of terminals employed by a BAW resonator device is variable. Again, the sensing scenarios with three-terminal BAW resonator devices are provided herein as examples, and are not intended to limit sensing scenarios to a particular BAW resonator device.

Figure 2A:
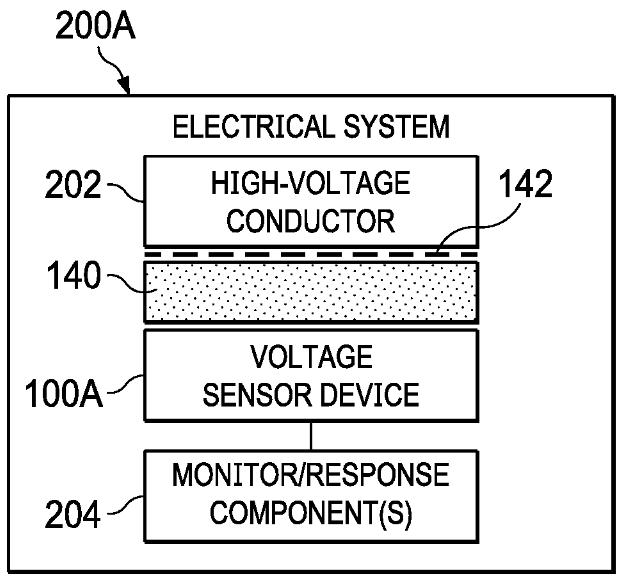
FIGS. 2A-2B show electrical systems that include the voltage sensor devices of FIGS. 1A and 1B in accordance with various examples.
Figure 2B:
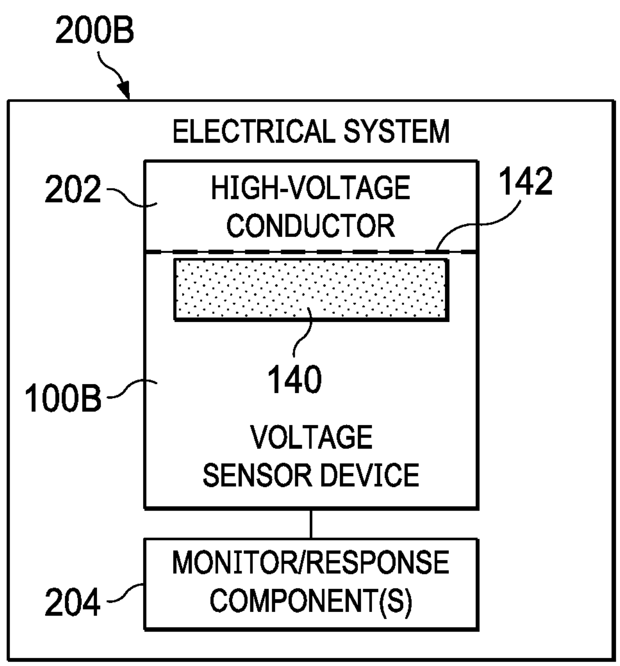

FIGS. 2A-2B show electrical systems that include the voltage sensor devices of FIGS. 1A and 1B in accordance with various examples. In FIG. 2A, the electrical system 200A include a high-voltage conductor 202 (e.g., on the order of 1000V or more), where a surface of the high-voltage conductor 202 correspond to the sensing interface 142. The voltage sensor device 100A is positioned near the high-voltage conductor 202 with select dielectric layers 140 added between the voltage sensor device 100A and the high-voltage conductor 202. The select dielectric layers 140 are used to target a desired sensitivity or voltage range for sensing operations of the voltage sensor device 100A related to the high-voltage conductor 202. The sensing components and operations for the voltage sensor device 100A may vary as described for FIG. 1A. Regardless of the particular sensing components and operations used, the voltage sense values determined by the voltage sensor device 100A are conveyed to monitor/response component(s) 204 of the electrical system 200A. The monitor/response component(s) 204 perform operations such as displaying a voltage sense value for the high-voltage conductor 202, regulating ongoing operations (e.g., to increase or decrease power or another parameter of an electrical system) of the electrical system 200A, and/or responding to emergencies or malfunctions within the electrical system 200A.

In FIG. 2B, the electrical system 200B includes a high-voltage conductor 202 (e.g., on the order of 1000V or more), where a surface of the high-voltage conductor 202 correspond to the sensing interface 142. The voltage sensor device 100B is positioned near the high-voltage conductor 202, and includes select dielectric layers 140 to target a desired sensitivity or voltage range for sensing operations of the voltage sensor device 100B related to the high-voltage conductor 202. The sensing components and operations for the voltage sensor device 100A may vary as described for FIG. 1B. Regardless of the particular sensing components and operations used, the voltage sense values determined by the voltage sensor device 100B are conveyed to monitor/response component(s) 204 of the electrical system 200B. Again, the monitor/response component(s) 204 perform operations such as displaying voltage sense values related to the high-voltage conductor 202, regulating ongoing operations (e.g., to increase or decrease power or another parameter of an electrical system) of the electrical system 200B, and/or responding to emergencies or malfunctions within the electrical system 200B.

Figure 3A:
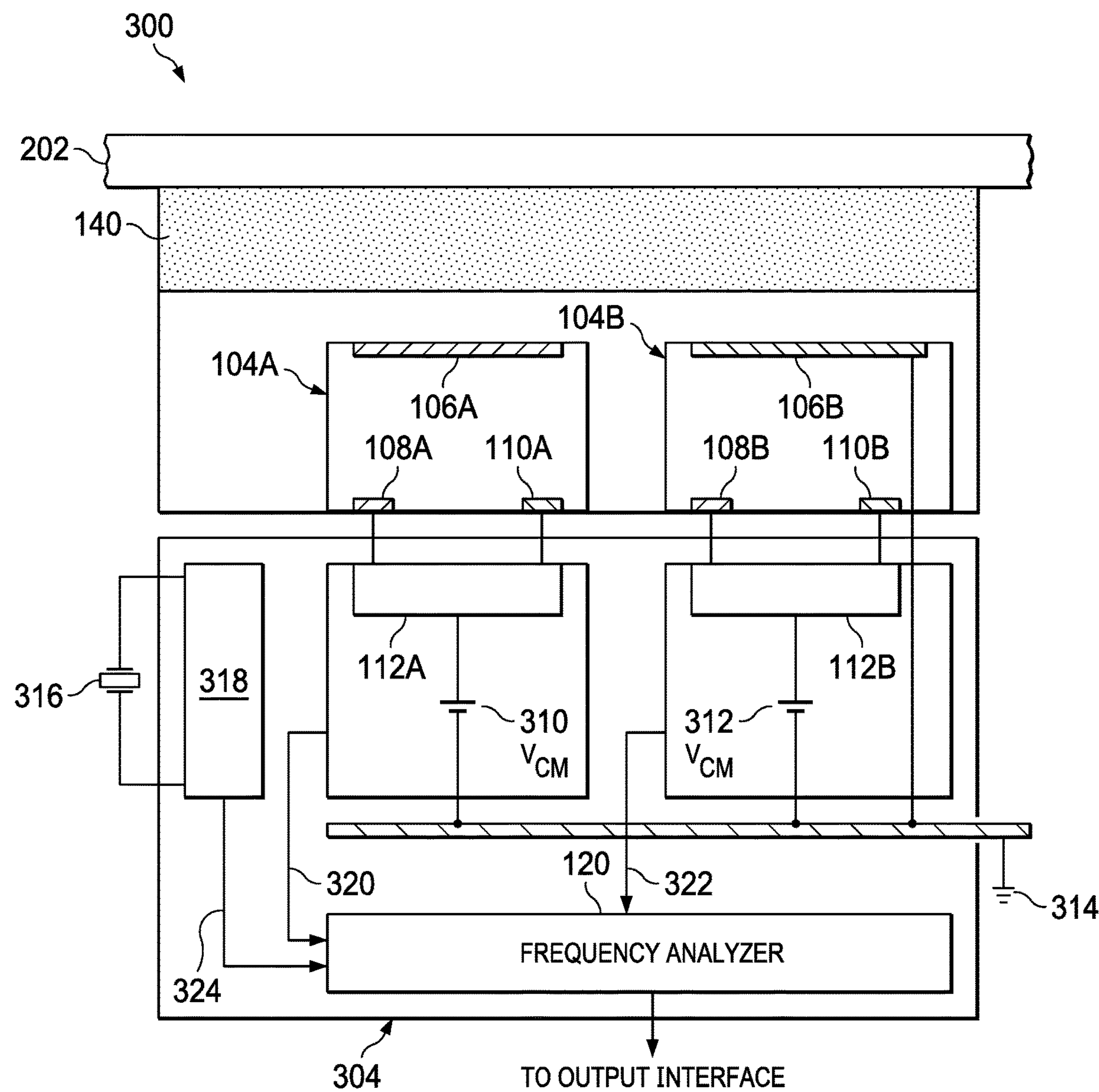
FIGS. 3A-3C show voltage sensing scenarios in accordance with various examples.
Figure 3B:
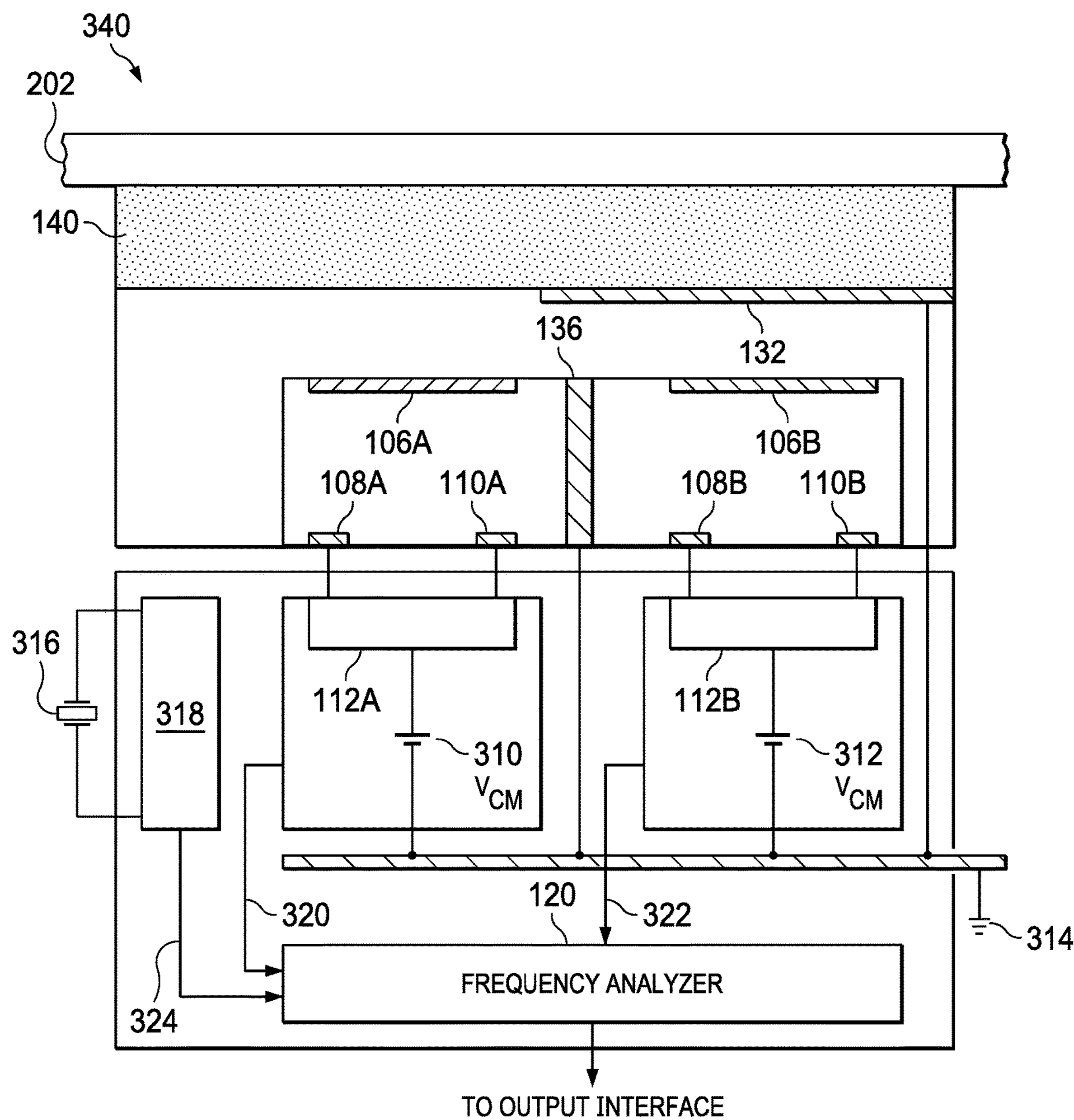
Figure 3C:
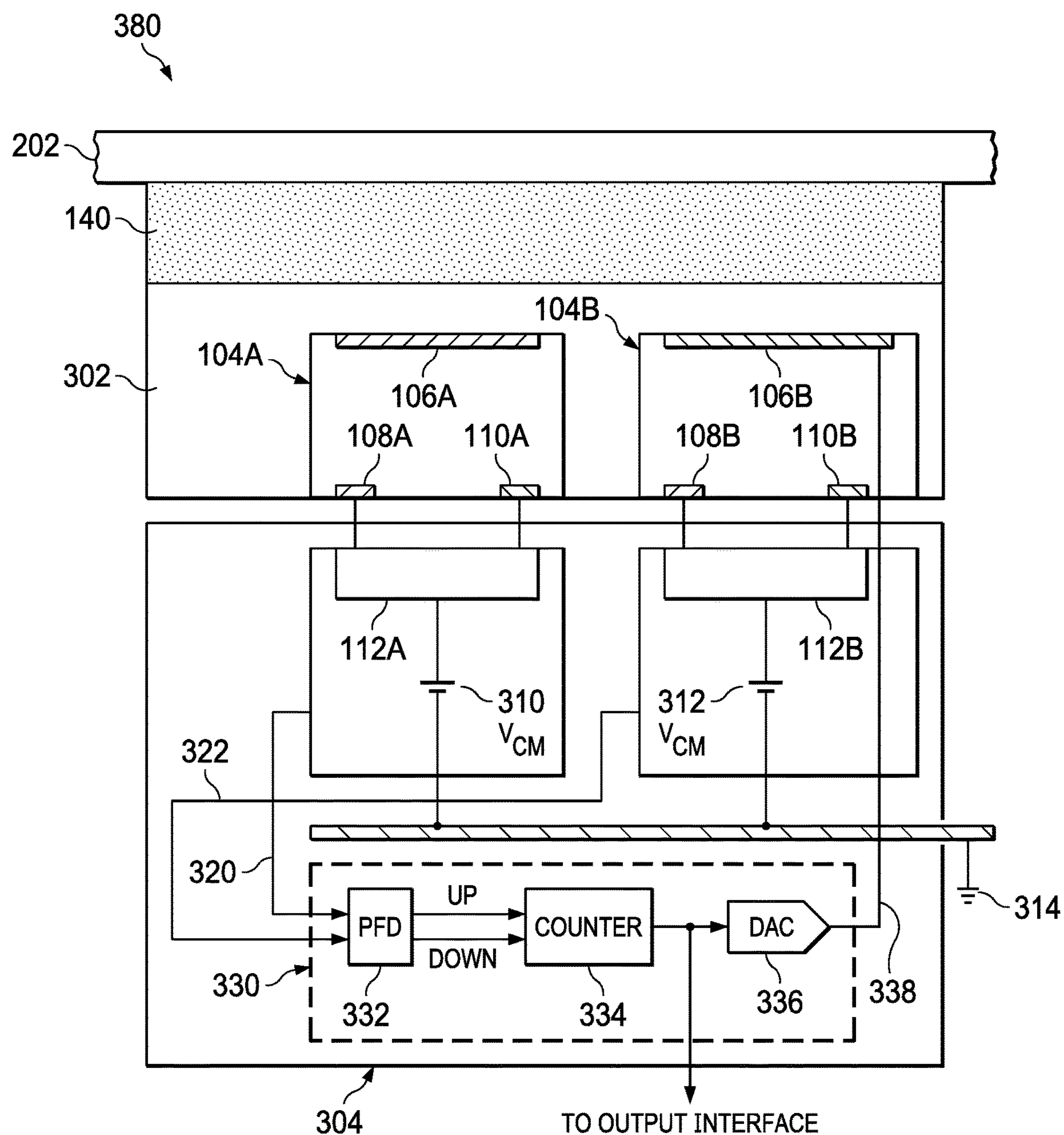

FIGS. 3A-3C show voltage sensing scenarios in accordance with various examples. In FIG. 3A, the voltage sensing scenario 300 involves sensing a voltage level for the high-voltage conductor 202 using various components discussed in FIGS. 1A and 1B. More specifically, in scenario 300, a pair of tunable BAW resonator devices 104A and 104B is separated from the high-voltage conductor 202 by the select dielectric layers 140. The bottom electrode 106A of the tunable BAW resonator device 104A is floating while the bottom electrode 106B of the tunable BAW resonator device 104B is grounded by connection to a ground node 314. The top electrodes 108A and 110A of the tunable BAW resonator device 104A couple to the oscillator core 112A, while the top electrodes 108B and 110B of the tunable BAW resonator device 104B couple to the oscillator core 112B. Each of the oscillator cores 112A and 112B is powered by respective voltage sources 310 and 312.

In scenario 300, the oscillator core 112A generates an output 320 with a biased frequency due to the unshielded position of the floating bottom electrode 106A relative to the high-voltage conductor 202. Meanwhile, the oscillator core 112B generates an output 322 with a default frequency due to the bottom electrode 106B being grounded. In scenario 300, a reference oscillator 318 coupled to a reference crystal 316 provides output 324 as a reference frequency. The different oscillator outputs 320, 322, and 324 are received by the frequency analyzer 120. In one example, the frequency analyzer 120 compares the outputs 320 and 322 to each other directly. In another example, the frequency analyzer 120 compares the outputs 320 and 322 to each other indirectly (e.g., the outputs 320 and 322 are compared to output 324, and the results are compared). In yet another example, the frequency analyzer 120 compares the output 320 to a predetermined frequency measurement for the tunable BAW resonator device 104A (e.g., by grounding the bottom electrode 106A to obtain a default frequency or by calculating a default frequency). In examples where only one oscillator output is analyzed, other components are omitted (e.g., at least the three-terminal BAW resonator device 104B and the oscillator core 112B are omitted). In the different examples, the biased frequency of an oscillator with a tunable BAW resonator is analyzed (e.g., compared to one or more reference frequencies or thresholds) to determine voltage sense values related to a voltage signal on the high-voltage conductor 202.

In the voltage sensing scenario 340 of FIG. 3B, many of the same components as described in the scenario 300 are involved and operations similar to those described for scenario 300 are performed. The difference between the scenario 300 of FIG. 3A and the scenario 340 of FIG. 3B is that scenario 340 uses shields 132 and 136 connected to the ground node 314 around the tunable BAW resonator device 104B. More specifically, the shield 132 is positioned between the tunable BAW resonator device 104B and the high-voltage conductor 202. Meanwhile, the shield 136 is positioned between the tunable BAW resonator device 104B and the tunable BAW resonator device 104A. With the shields 132 and 136 grounded, the high-voltage conductor 202 and the tunable BAW resonator device 104A should not significantly affect the floating bottom-electrode 106B of the tunable BAW resonator device 104B. Accordingly, the output 322 of the oscillator core 112B again has a default frequency usable as a reference.

In scenario 340, the oscillator core 112A generates an output 320 with a biased frequency due to the unshielded position of the floating bottom electrode 106A relative to the high-voltage conductor 202. Meanwhile, the oscillator core 112B generates an output 322 with a default frequency due to the shields 132 and 136 being grounded (the bottom electrode 106B is left floating or is grounded). In scenario 300, the reference oscillator 318 coupled to a reference crystal 316 provides output 324 as a reference frequency. The different oscillator outputs 320, 322, and 324 are received by the frequency analyzer 120. In scenario 340, the frequency analyzer 120 uses one or more of the outputs 320, 322, and 324 (as described for scenario 300) to determine voltage sense values related to a voltage signal on the high-voltage conductor 202.

In the voltage sensing scenario 380 of FIG. 3C, many of the same components as described in the scenario 300 are involved and operations similar to those described for scenario 300 are performed. The difference between the scenario 300 of FIG. 3A and the scenario 380 of FIG. 3C is that scenario 380 omits the reference crystal 316 and reference 318, and employs a feedback arrangement 330 to set the voltage applied to the bottom electrode 106B of the tunable BAW resonator device 104B. In some examples, the feedback arrangement 330 includes a phase/frequency detector (PFD) 332 configured to receive the outputs 320 and 322 from the respective oscillator cores 112A and 112B. The PFD 332 compares the outputs 320 and 322, and adjusts a counter 334 up or down. The output of the counter 334 is provided to the output interface as a voltage sense value. Accordingly, for the voltage sensing scenario 380 of FIG. 3C, the PFD 332 performs a frequency analysis or comparison that results in a voltage sense value.

The output of the counter 334 is also provided to a digital-to-analog converter (DAC) 336 coupled to the bottom electrode 106B of the tunable BAW resonator device 104B. The DAC 336 operates to multiply the counter output by a reference voltage, resulting in the bottom electrode 106B being set to a voltage level determined by the counter 334 and the reference voltage. Eventually (after several iterations), the voltage level of the bottom electrode 106B is set to the same voltage level as the bottom electrode 106A of the tunable BAW resonator device 104A. Thereafter, changes to the voltage carried by the high-voltage conductor 202 result in the bottom electrode 106A of the tunable BAW resonator device 104A having a different voltage value than the bottom electrode 106B of the tunable BAW resonator device 104B, and the counter 334 is updated as needed. In some examples, a feedback arrangement 330 includes a charge pump and a capacitor (e.g., as in a PLL arrangement) to set the voltage level of the bottom electrode 106B of the tunable BAW resonator device 104B based on the result of PFD 332. In such examples, the counter 334 and the DAC 336 for the feedback arrangement 330 are omitted. Regardless of the particular components used for the feedback arrangement 330, the voltage sensing scenario 380 uses one oscillator unit (e.g., the tunable BAW resonator device 104A and oscillator core 112A) as a voltage sense oscillator unit and another oscillator unit (e.g., the tunable BAW resonator device 104B and oscillator core 112B) as a reference oscillator unit, where the feedback arrangement 330 is configured to adjust a frequency for the reference oscillator unit based on a frequency for the voltage sense oscillator unit.

In different examples, the components for each scenario 300, 340, and 380 (excepting the high-voltage conductor 202) are part of one integrated circuit corresponding to a voltage sensor device. In other examples, a voltage sensor device omits the select dielectric layers 140. In other examples, the tunable BAW resonator devices, the oscillator cores, the reference oscillator 318, the feedback arrangement 330 and/or the frequency analyzer 120 corresponds to separate integrated circuits or chips, where separate integrated circuits can be packaged together or coupled to a printed circuit board (PCB).

Figure 4A:
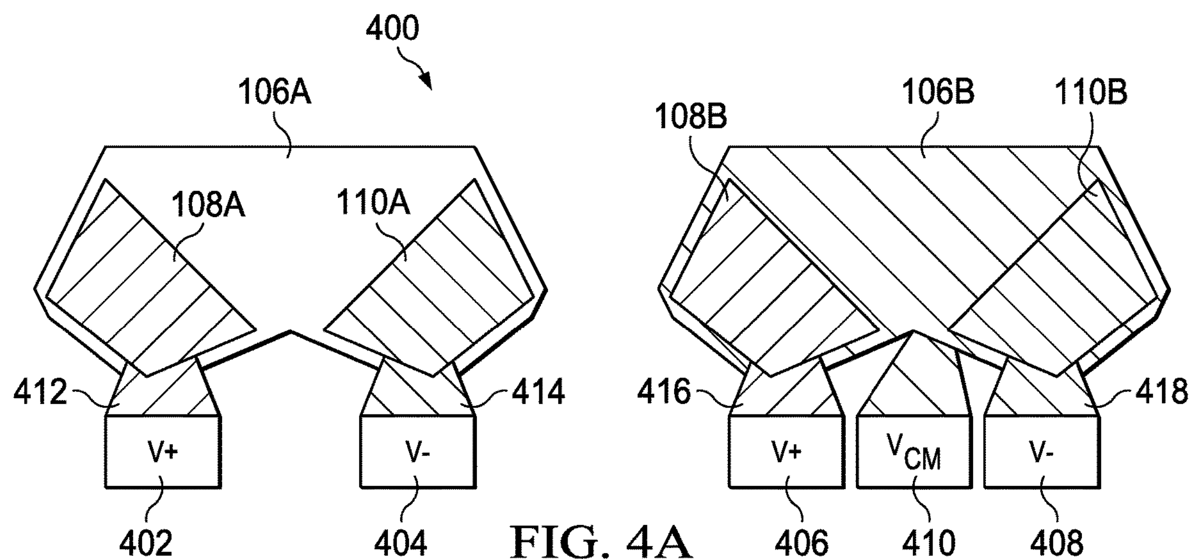
FIGS. 4A-4C show tunable BAW resonator electrode layouts in accordance with various examples.
Figure 4B:
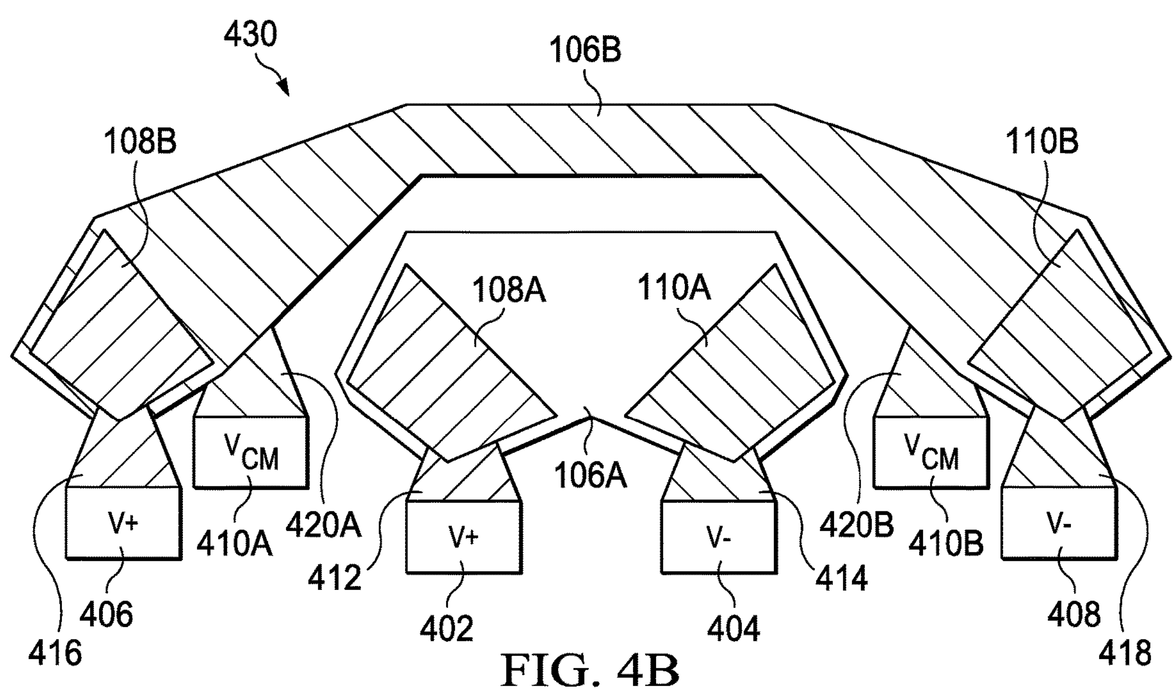
Figure 4C:
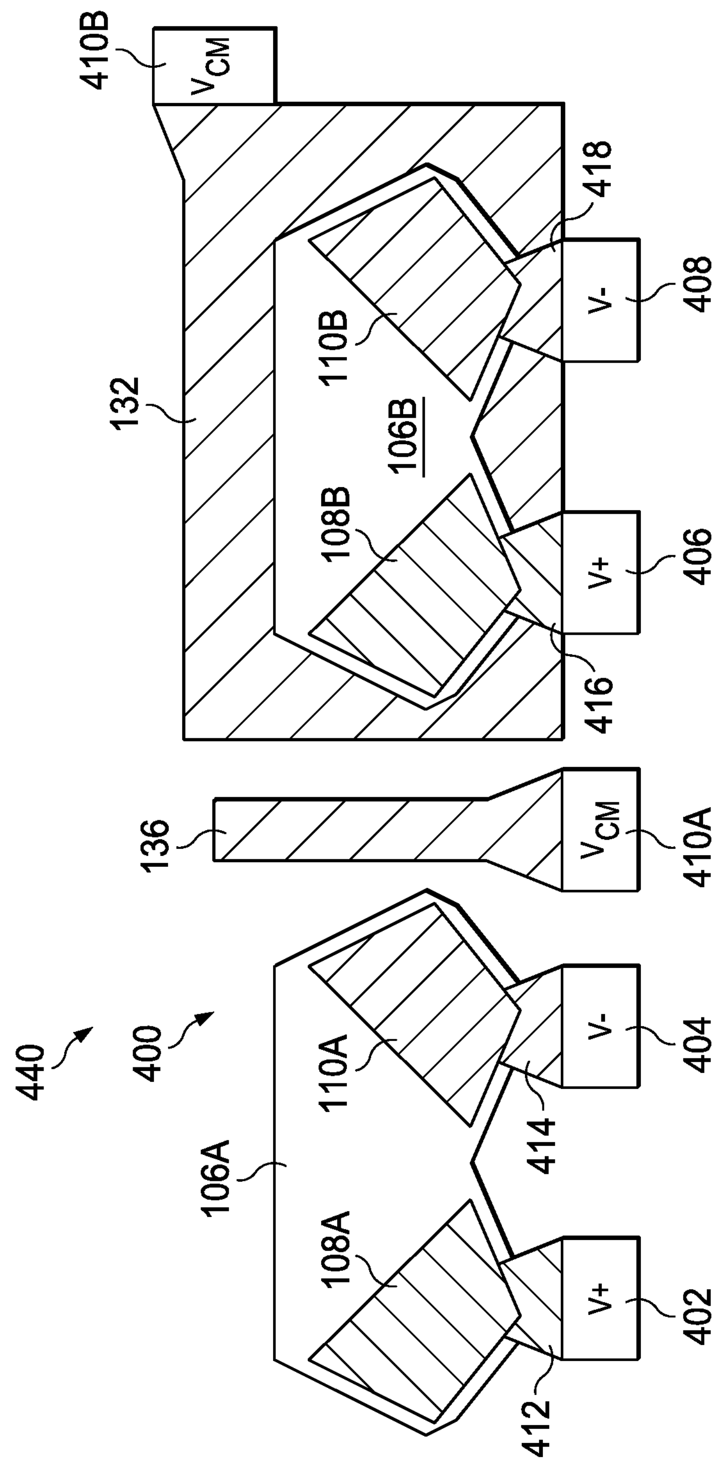

FIGS. 4A-4C show BAW resonator electrode layouts for voltage sensing in accordance with various examples. In FIG. 4A, a top view 400 of electrodes for a pair of three-electrode BAW resonators is represented. More specifically, the top view 400 shows the bottom electrode 106A and the top electrodes 108A and 110A of a first tunable BAW resonator device (e.g., device 104A). As previously discussed, the bottom electrode 106A remains floating during sensing operations. Meanwhile, the top electrode 108A couples to an oscillator terminal 402 via metal layer 412. The oscillator terminal 402 represents a pin or pad that receives to a first differential signal (V+) of an oscillator core (e.g., the oscillator core 112A) during sensing operations. The other top electrode 110A couples to another oscillator terminal 404 via metal layer 414. The oscillator terminal 404 represents a pin or pad that receives a second differential signal (V−) of an oscillator core (e.g., the oscillator core 112A) during sensing operations.

In the top view 400, the bottom electrode 106B and the top electrodes 108B and 110B of a second tunable BAW resonator device (e.g., device 104B) are also represented. The bottom electrode 106B is grounded or coupled to a common-mode voltage (Vcm). Meanwhile, the top electrode 108B couples to an oscillator terminal 406 via metal layer 416. The oscillator terminal 406 represents a pin or pad that receives a first differential signal (V+) of an oscillator core (e.g., the oscillator core 112B) during sensing operations. The other top electrode 110B couples to another oscillator terminal 408 via metal layer 418. The oscillator terminal 408 represents a pin or pad that receives a second differential signal (V−) of an oscillator core (e.g., the oscillator core 112B) during sensing operations. In some examples, the electrodes represented in FIG. 4A are part of a single integrated circuit that includes a pair of tunable BAW resonator devices. In other examples, the electrodes represented in FIG. 4A are part of a two integrated circuits, each integrated circuit having a tunable BAW resonator device.

In FIG. 4B, a top view 430 of electrodes for a pair of three-electrode BAW resonators is represented. More specifically, the top view 430 shows the bottom electrode 106A and the top electrodes 108A and 110A of a first tunable BAW resonator device (e.g., device 104A). As previously discussed, the bottom electrode 106A remains floating during sensing operations. Again, the top electrode 108A couples to the oscillator terminal 402 via metal layer 412. The oscillator terminal 402 represents a pin or pad that receives a first differential signal (V+) of an oscillator core (e.g., the oscillator core 112A) during sensing operations. The other top electrode 110A couples to another oscillator terminal 404 via metal layer 414. The oscillator terminal 404 represents a pin or pad that receives a second differential signal (V−) of an oscillator core (e.g., the oscillator core 112A) during sensing operations.

In the top view 430, the bottom electrode 106B and the top electrodes 108B and 110B of a second tunable BAW resonator device (e.g., device 104B) are also represented. The bottom electrode 106B is grounded or coupled to a common-mode voltage (Vcm). Meanwhile, the top electrode 108B couples to an oscillator terminal 406 via metal layer 416. The oscillator terminal 406 represents a pin or pad that receives a first differential signal (V+) of an oscillator core (e.g., the oscillator core 112B) during sensing operations. The other top electrode 110B couples to another oscillator terminal 408 via metal layer 418. The oscillator terminal 408 represents a pin or pad that receives a second differential signal (V−) of an oscillator core (e.g., the oscillator core 112B) during sensing operations.

In FIG. 4B, the bottom electrode 106B has a shape that partially surrounds the bottom electrode 106A. Also, the bottom electrodes 106A and 106B have a common centroid arrangement. With the arrangement represented in FIG. 4B, voltage sensing variations due to stress gradients are reduced compared to the arrangement of FIG. 4A. In some examples, the electrodes represented in FIG. 4B are part of a single integrated circuit that includes a pair of tunable BAW resonator devices.

In FIG. 4C, a top view 440 of electrodes for a pair of three-electrode BAW resonators is represented. More specifically, the top view 440 shows the same electrodes represented in FIG. 4A, except that shields 132 and 136 have been added. More specifically, the shield 132 is a metal layer below and separate from the electrodes 106B, 108B, and 110B. As shown, the shield 132 couples to a ground node terminal 410B. Meanwhile, the shield 136 is a metal layer between the bottom electrodes 106A and 106B. As shown, the shield 136 couples to a ground node terminal 410A. In some examples, the ground node terminals 410A and 410B are a single ground node terminal. With the shields 132 and 136, both bottom electrodes 106A and 106B float during sensing operations as described herein.

Figure 5A:
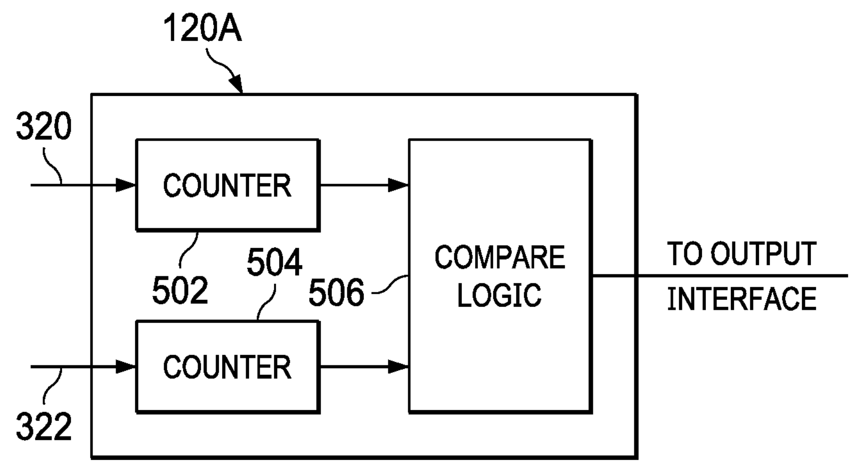
FIGS. 5A and 5B show frequency analyzer options in accordance with various examples.
Figure 5B:
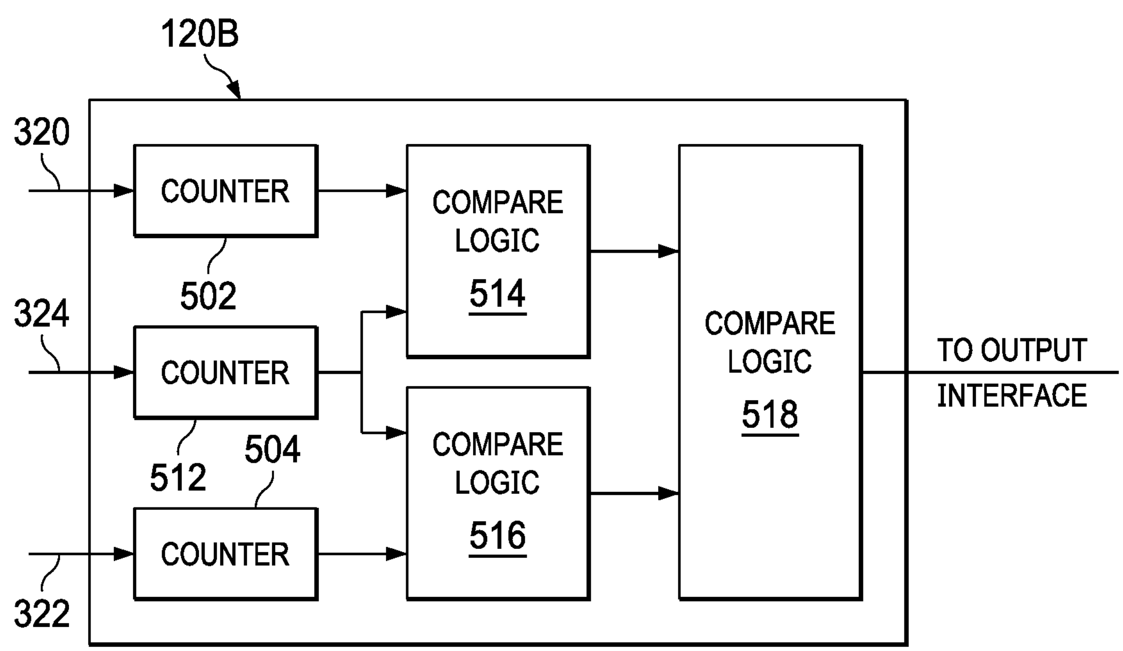

FIGS. 5A-5B show frequency analyzer options in accordance with various examples. In FIG. 5A, a frequency analyzer 120A includes two counters 502 and 504 coupled to compare logic 506. In the example of FIG. 5A, the counter 502 provides a count value based on the output 320 from the oscillator core 112A. Meanwhile, the counter 504 provides a count value based on the output 322 from the oscillator core 112B. The compare logic 506 compares the count values for the counters 502 and 504. The difference between the count values is provided to an output interface (e.g., the output interface 130 in FIGS. 1A and 1B) as a voltage sense value. In different examples, the compare logic 506 corresponds to a comparator, a subtract circuit, a digital signal processor (DSP) with memory, or programmable logic. For the frequency analyzer 120A of FIG. 5A, the outputs 320 and 322 from the oscillator cores 112A and 112B are compared directly to obtain a voltage sense value (e.g., using the counters 502 and 504 and compare logic 506).

In FIG. 5B, a frequency analyzer 120B includes three counters 502, 504, and 506 coupled to compare logic 514 and 516. In the example of FIG. 5A, the counter 502 provides a count value based on the output 320 from the oscillator core 112A. Meanwhile, the counter 504 provides a count value based on the output 322 from the oscillator core 112B. Finally, the counter 506 provides a count value based on the output 324 from the reference oscillator 318. The compare logic 514 compares the count values for the counters 502 and 512. Meanwhile, the compare logic 516 compares the count values for the counters 504 and 512. The outputs of compare logic 514 and 516 is compared by compare logic 518, and the output of compare logic 518 is provided to an output interface (e.g., the output interface 130 in FIGS. 1A and 1B) as a voltage sense value. In different examples, the compare logic 514, 516, and 518 corresponds to comparators, subtract circuits, a digital signal processor (DSP) with memory, or programmable logic. For the frequency analyzer 120B of FIG. 5B, the outputs 320 and 322 from the oscillator cores 112A and 112B are compared indirectly to obtain a voltage sense value (e.g., the outputs 320 and 322 are first compared to the output 324 of the reference oscillator 318, and the resulting compare values are compared to obtain a voltage sense value). In different frequency analyzer examples, counter and compare logic components vary.

Figure 6A:
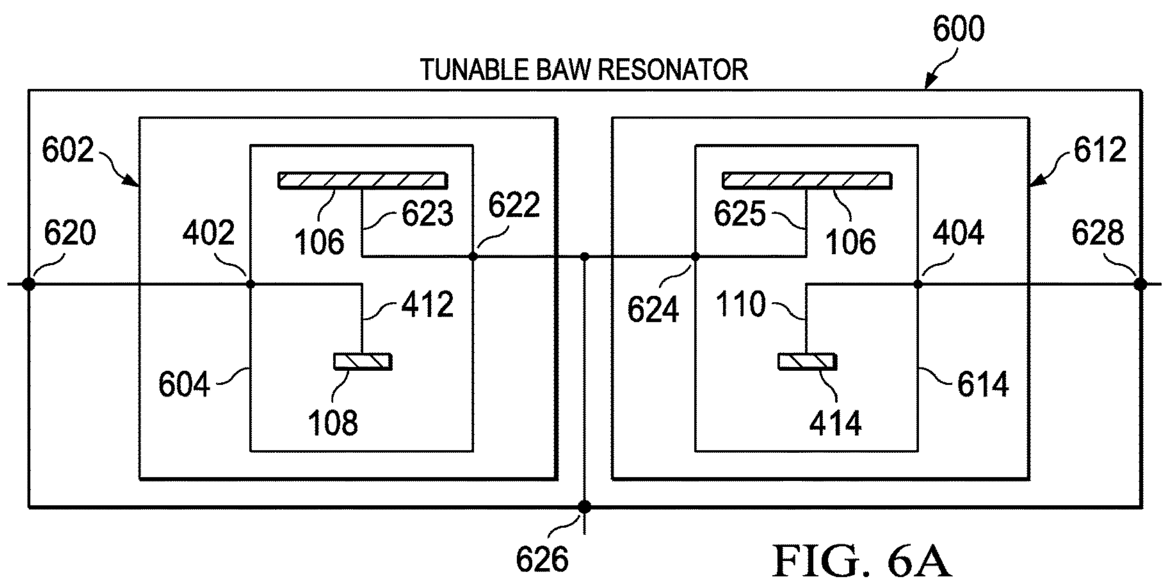
FIGS. 6A-6C show tunable BAW resonator device options in accordance with various examples.
Figure 6B:
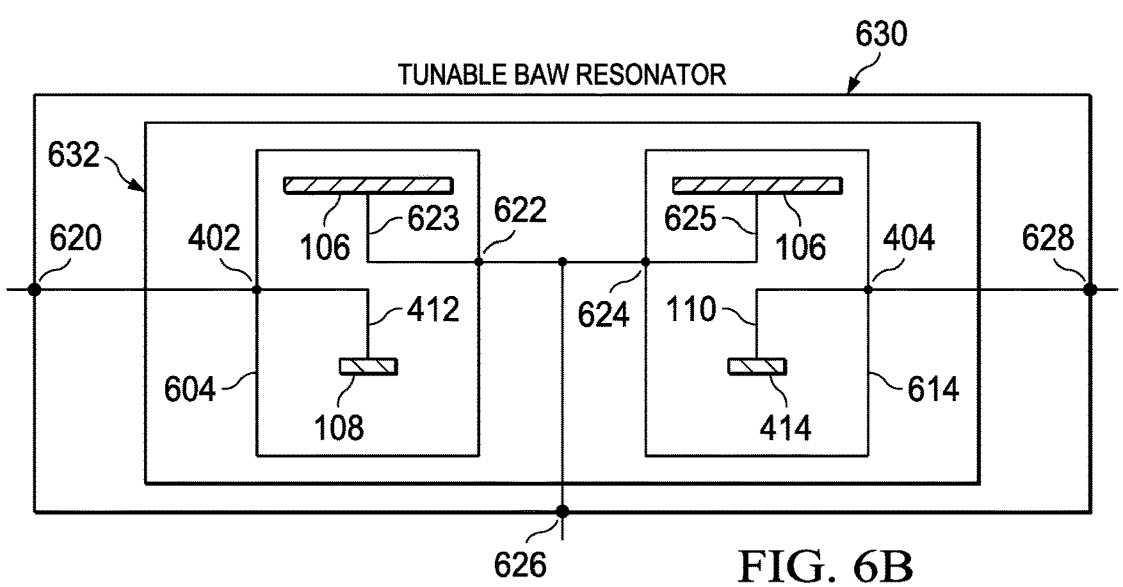
Figure 6C:
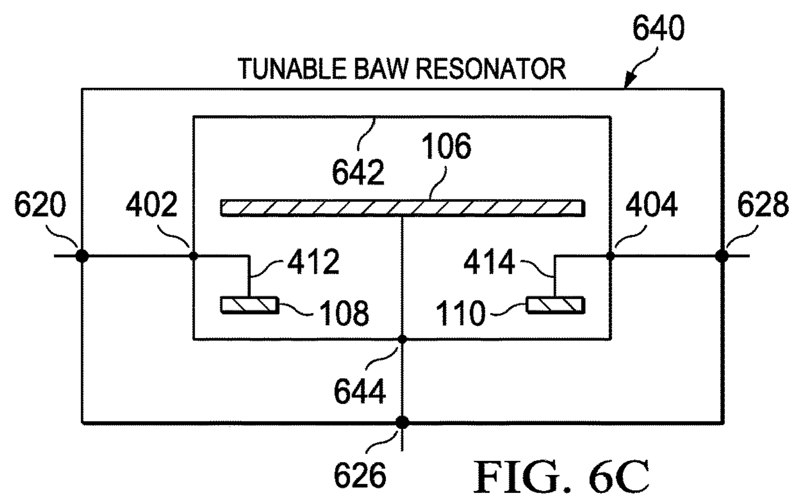

FIGS. 6A-6C show tunable BAW resonator device options in accordance with various examples. In FIG. 6A, the tunable BAW resonator device 600 includes a pair of two-electrode BAW resonator cores 604 and 614 on respective integrated circuits 602 and 612. Each of the two-electrode BAW resonator cores 604 and 614 includes a bottom electrode 106. As represented in FIG. 6A, the bottom electrodes 106 for the two-electrode BAW resonator cores 604 and 614 operate as a single electrode by being coupled together via metal layers 623 and 625, nodes 622 and 624, and connections between the nodes 622 and 624. During sensing operations, the bottom electrodes 106 are left floating and/or are coupled to ground via a control terminal 626. In some examples, the control terminal 626 is omitted in sensing scenarios where the bottom electrodes 106 are always floating (e.g., if external shields 132 and 136 are used instead of grounding the bottom electrodes 106). Meanwhile, the top electrode 108 of the two-electrode BAW resonator core 604 couples to a first oscillator terminal 620 via metal layer 412 and node 402 (see FIGS. 4A-4C). Also, the top electrode 110 of the two-electrode BAW resonator core 614 couples to a second oscillator terminal 628 via metal layer 414 and node 404 (see FIGS. 4A-4C). The first and second oscillator terminals 620 and 628 couple the top electrodes 108 and 110 to an oscillator core as described herein.

In FIG. 6B, the tunable BAW resonator device 630 has mostly the same components as described for the tunable BAW resonator device 600. The difference between the tunable BAW resonator device 630 and the tunable BAW resonator device 600 is that the two-electrode BAW resonator cores 604 and 614 are part of a single integrated circuit 632.

In FIG. 6C, the tunable BAW resonator device 640 employs a single three-electrode BAW resonator core 642 having a bottom electrode 106 and two top electrode 108 and 110. During sensing operations, the bottom electrode 106 is left floating and/or is coupled to ground via a control terminal 626 and node 644. Meanwhile, the top electrode 108 of the three-electrode BAW resonator core 642 couples to a first oscillator terminal 620 via metal layer 412 and node 402 (see FIGS. 4A-4C). Also, the top electrode 110 of the three-electrode BAW resonator core 642 couples to a second oscillator terminal 628 via metal layer 414 and node 404 (see FIGS. 4A-4C). The first and second oscillator terminals 620 and 628 couple the top electrodes 108 and 110 to an oscillator core as described herein.

Figure 7A:
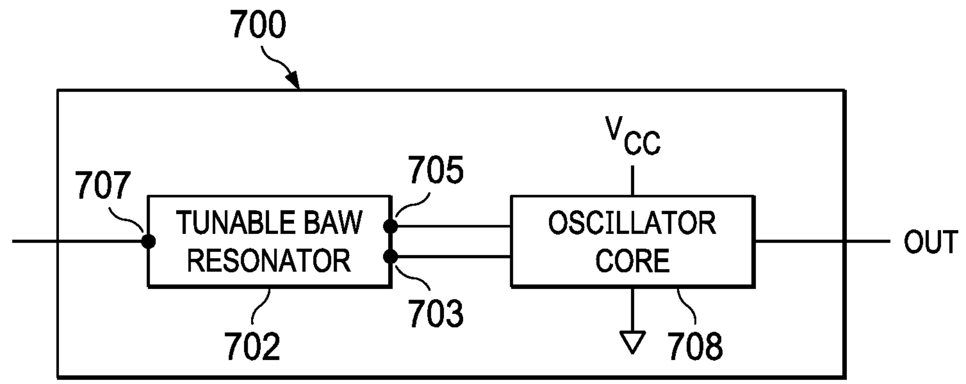
FIGS. 7A-7C show oscillator unit options in accordance with various examples.
Figure 7B:
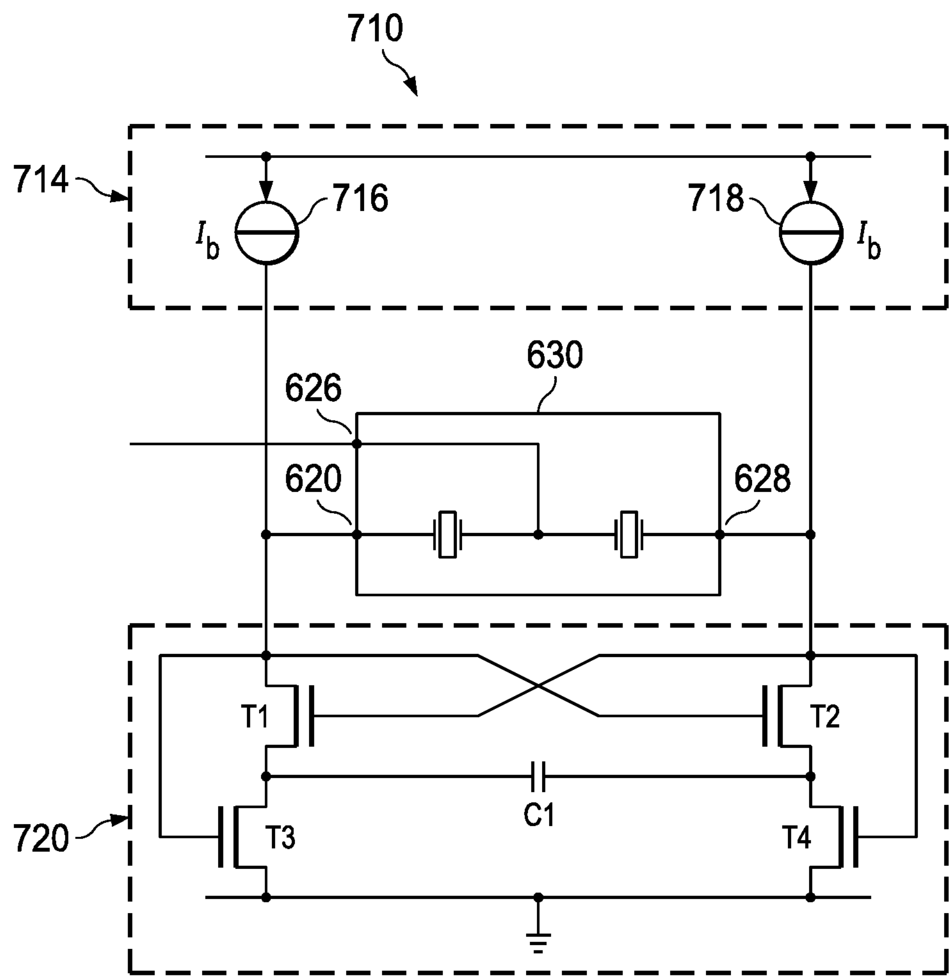
Figure 7C:
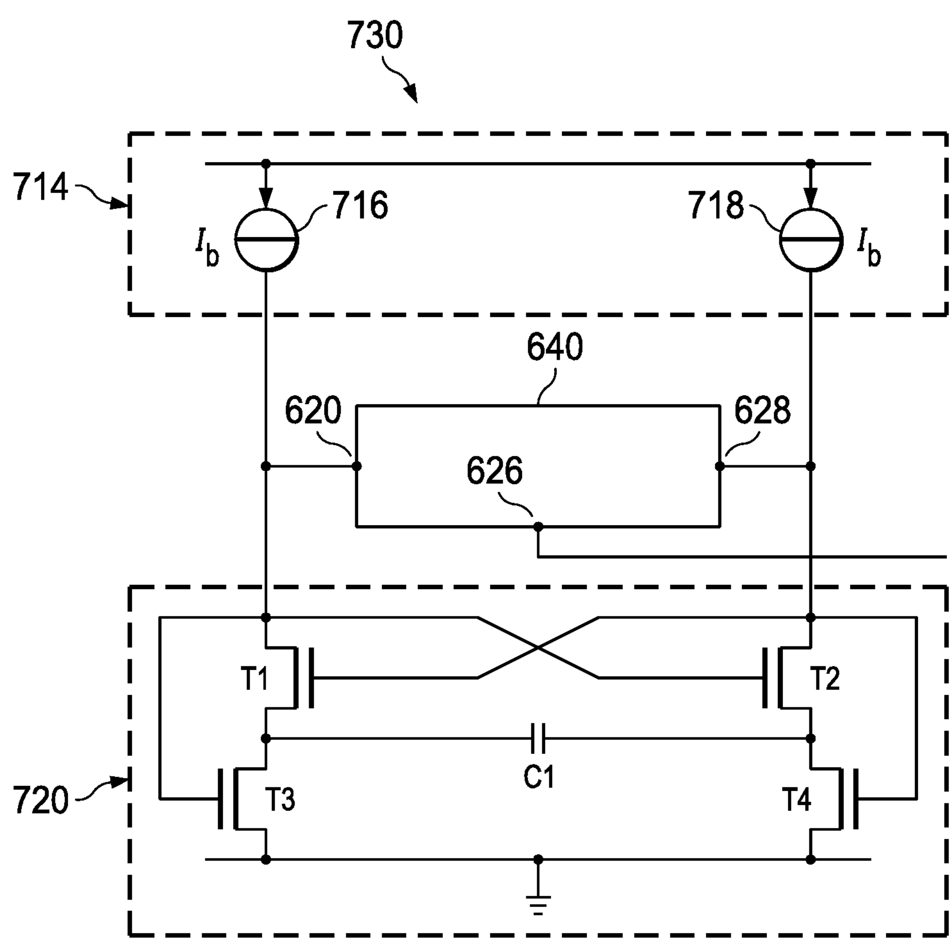

FIGS. 7A-7C show oscillator unit options in accordance with various examples. In FIG. 7A, a block diagram of an oscillator unit 700 including a tunable BAW resonator device 702 (e.g., one of the devices 600, 630, or 640 in FIGS. 6A-6C). As shown, the tunable BAW resonator device 702 has two oscillator terminals 703 and 705 coupled to an oscillator core 708. While not shown, the oscillator terminals 703 and 705 couple to the top electrodes of the tunable BAW resonator device 702. Meanwhile, a third terminal 707 (see e.g., the control terminal 626 in FIGS. 6A-6C) of the tunable BAW resonator device 702 is left floating or is grounded as described herein (depending on whether the tunable BAW resonator device 702 and the oscillator core 708 are used to sense a voltage or are used to provide a reference). In other examples, the third terminal 707 of the tunable BAW resonator device 702 couples to a feedback arrangement (e.g., the feedback arrangement 330 of FIG. 3C) and is set to a voltage value that tracks the voltage value of the bottom-electrode of another tunable BAW resonator device being used to sense a voltage as described herein (see e.g., FIG. 3C).

In some examples, the oscillator unit 700 corresponds to a stacked package (e.g., flip chip assembly) or a lateral package arrangement. In other examples, the tunable BAW resonator device 702 and oscillator core 708 are formed on the same die. Also, the oscillator core 708 has bond pads (not shown) for being coupled between a voltage supply terminal (VCC) and a lower voltage shown as a ground, and for being coupled to the oscillator terminals 703 and 705 of the tunable BAW resonator device 702.

In operation, the tunable BAW resonator device 702 functions as a reference signal generator which provides the signal input for the oscillator core 708. In various examples, the oscillator core 708 comprises active and passive circuit elements (e.g., capacitors) capable of sustaining oscillations and amplifying the signal from the tunable BAW resonator device 702 to provide the output signal shown as shown as OUT. Construction features of the tunable BAW resonator device 702 (e.g., the thickness of its piezoelectric layer(s)) determines the oscillation frequency. In one example, the oscillator core 708 is a Colpitts oscillator.

FIG. 7B shows a schematic diagram of an oscillator unit 710 with the tunable BAW resonator device 630 coupled to oscillator circuitry in accordance with various examples. As described herein, a third terminal 626 (see e.g., the control terminal 626 in FIGS. 6A-6C) of the tunable BAW resonator device 630, which couples to a pair of bottom electrodes, is left floating or is grounded during sensing operations (depending on whether the tunable BAW resonator device 630 and related oscillator circuitry is used to sense a voltage or is used as a reference). In other examples, the third terminal 626 of the tunable BAW resonator device 630 couples to a feedback arrangement (e.g., the feedback arrangement 330 of FIG. 3C) and is set to a voltage value that tracks the voltage value of the bottom-electrode of another tunable BAW resonator device being used to sense a voltage as described herein (see e.g., FIG. 3C).

As shown in FIG. 7B, the first and second oscillator terminals 620 and 628 of the tunable BAW resonator 630 couple to respective transistors (T1 and T2) of an oscillator circuit 720. The oscillator circuit 720 also includes a capacitor (C1), and additional transistors (T3 and T4). As desired, T1 and T2 of the oscillator circuit 720 are biased by current sources 716 and 718 of a bias circuit 714. In different examples, the components of the bias circuit 714 (e.g., the component topology for the current sources 714 and 716), and the components of the oscillator circuit 720 (e.g., the oscillator core topology) vary.

FIG. 7C shows a schematic diagram of an oscillator unit 730 with the tunable BAW resonator device 640 coupled to oscillator circuitry in accordance with various examples. The oscillator unit 730 of FIG. 7C is the same as the oscillator unit 710 of FIG. 7B, except the tunable BAW resonator device 640 is used in FIG. 7C instead of the tunable BAW resonator device 630. As described herein, a third terminal 626 of the tunable BAW resonator device 640 (which couples to a bottom electrode) is left floating or is grounded during sensing operations (depending on whether the tunable BAW resonator device 640 and related oscillator circuitry is used to sense a voltage or is used as a reference). In other examples, the third terminal 626 of the tunable BAW resonator device 640 couples to a feedback arrangement (e.g., the feedback arrangement 330 of FIG. 3C) and is set to a voltage value that tracks the voltage value of the bottom-electrode of another tunable BAW resonator device being used to sense a voltage as described herein (see e.g., FIG. 3C).

The other components for the oscillator unit 730 follow the discussion given for the oscillator unit 710 of FIG. 7B. In different examples, the oscillator units 700, 710, and 730 of FIGS. 7A-7C are used for sensing operations as described herein by providing either a biased frequency (e.g., a biased frequency due to a bottom electrode acquiring a voltage value due to a nearby conductor) or a default/reference frequency (e.g., a ground value, a shielded value, or a feedback-based value).

Figure 8:
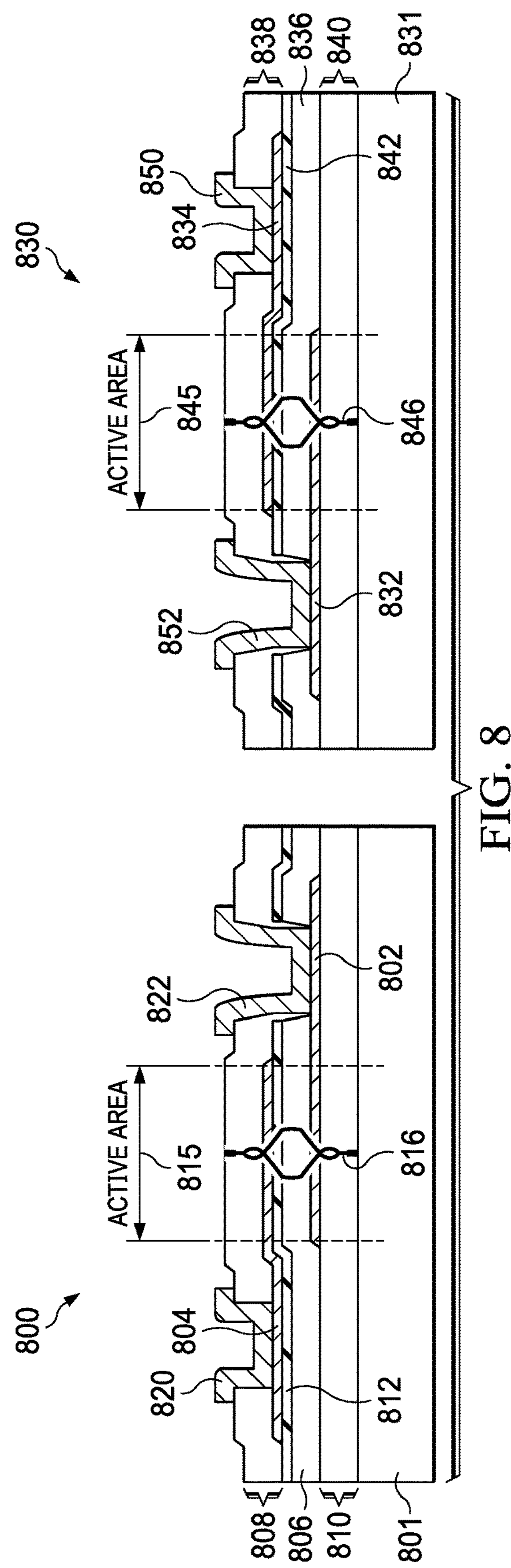
FIGS. 8 and 9 show cross-sectional views of BAW resonator cores in accordance with various examples.
Figure 9:
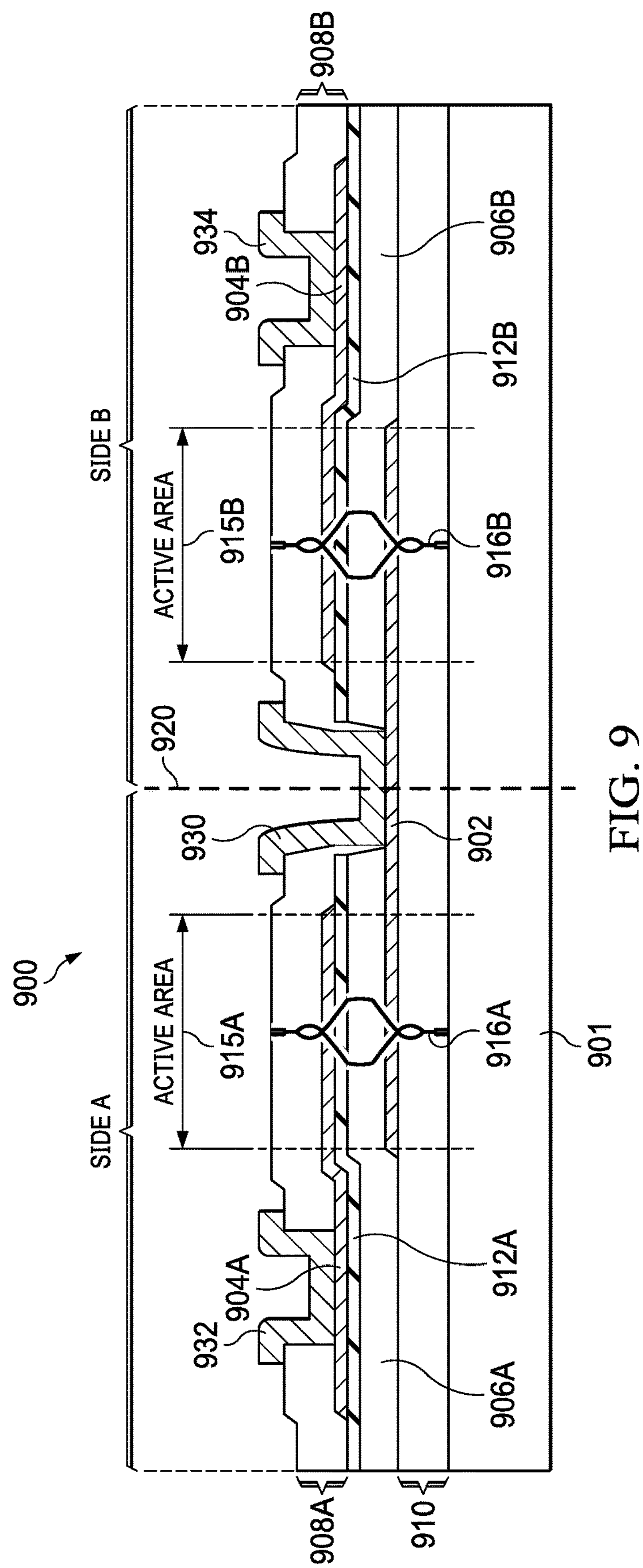

FIGS. 8 and 9 show cross-sectional views of BAW resonator cores in accordance with various examples. More specifically, FIG. 8 shows a cross-sectional view of a pair of two-electrode BAW resonator cores 800 and 830 used for a tunable BAW resonator device in accordance with various examples (e.g., see FIGS. 6A and 6B). Each of two-electrode BAW resonator cores 800 and 830 in FIG. 5 is an example of a solidly-mounted resonator (SMR) that includes various layers formed over respective semiconductor substrates 801 and 831.

As shown in FIG. 8, the two-electrode BAW resonator core 800 includes various layers formed over a semiconductor substrate 801. More specifically, the layers formed over the semiconductor substrate 801 include electro-active materials 810 (e.g., Bragg mirrors), a bottom electrode 802, electro-active materials 806 (e.g., piezoelectric materials), an insulative layer 812, a top electrode 804, and electro-active materials 808 (e.g., Bragg mirrors). The two-electrode BAW resonator core 800 also includes a first metal node 820 that couples to the top electrode 804, and a second metal node 822 that couples to the bottom electrode 802. In some examples, the metal node 820 corresponds to oscillator terminal 620 of the device 600 in FIG. 6A, or to oscillator terminal 620 of the device 630 in FIG. 6B. In other examples, the metal node 820 couples to an external metal terminal (not shown) that facilitates coupling a tunable BAW resonator device with the pair of two-electrode BAW resonator cores 800 and 830 to other components (e.g., components of an oscillator unit). Also, in some examples, the second metal node 822 couples to an external metal terminal (not shown) corresponding to the control terminal 626 of the device 600 in FIG. 6A, or to the control terminal 626 of the device 630 in FIG. 6B.

The second two-electrode BAW resonator core 830 also includes various layers formed over a semiconductor substrate 831. More specifically, the layers formed over the semiconductor substrate 831 include electro-active materials 840 (e.g., Bragg mirrors), a bottom electrode 832, electro-active materials 836 (e.g., piezoelectric materials), an insulative layer 842, a top electrode 834, and electro-active materials 838 (e.g., Bragg mirrors). The two-electrode BAW resonator core 830 also includes a first metal node 850 that couples to the top electrode 834, and a second metal node 852 that couples to the bottom electrode 832. In some examples, the first metal node 850 corresponds to oscillator terminal 628 of the device 600 in FIG. 6A, or to oscillator terminal 628 of the device 630 in FIG. 6B. In other examples, the first metal node 850 couples to an external metal terminal (not shown) that facilitates coupling a tunable BAW device with the pair of two-electrode BAW resonator cores 800 and 830 to other components (e.g., components of an oscillator unit). Also, in some examples, the second metal node 852 couples to an external metal terminal (not shown) corresponding to the control terminal 626 of the device 600 in FIG. 6A, or to the control terminal 626 of the device 630 in FIG. 6B. In the above description, the top electrodes 804 and 834 couple to separate oscillator terminals, while the bottom electrodes 802 and 832 couple to a control terminal. In other examples, the top electrodes 804 and 834 couple to a control terminal, while the bottom electrodes 802 and 832 couple to separate oscillator terminals.

In various examples, the substrates 801 and 831 is formed from silicon, the electro-active materials 810 and 840 include layers from different materials such as silicon carbide (SiC), methyl silsesquioxane (MSQ), silicon dioxide (SiO2), silicon carbo hydroxide (SiCOH), silicon nitride (SiN), Tungsten (W), Titanium Tungsten (TiW), or Copper (Cu), and the bottom electrode 802 and 832 are formed from a metal such as W, Cu, Aluminum (Al), or molybdenum (Mo). In various examples, the electro-active materials 806 and 836 are formed from aluminum nitride (AlN) or lead zirconate titanate (PZT), the insulative layers 812 and 842 are formed from an oxide material, the top electrodes 804 and 834 are formed from a metal such as W, Cu, Al, or Mo, and the electro-active materials 808 and 838 include layers from different materials such as SiC, MSQ, SiO2, SiCOH, SiN, W, TiW, or Cu.

In operation, the pair of two-electrode BAW resonator cores 800 and 830 have two active areas 815 and 545, where mechanical energy is confined and isolated. The active areas 815 and 845 are created by the various layers and applied signals. More specifically, the active area 815 occurs where there is overlap between the bottom electrode 802 and the top electrode 804 in the two-electrode BAW resonator core 800. Meanwhile, the active area 845 occurs where there is overlap between the bottom electrode 832 and the top electrode 834 in the two-electrode BAW resonator core 530.

When the bottom electrodes 802 and 832 are positioned nearby a high-voltage conductor their voltage level is affected and the behavior of the active areas 815 and 845 is modified due to the effect of the bottom electrode's voltage level on a physical characteristic (e.g., size, internal stress/strain, and/or shape) of one or more of the electro-active materials 810, 840, 806, 836, 808 and 838. Accordingly, in some examples, the center frequency of the two-electrode BAW resonator cores 800 and 830 are used to sense a voltage carried by a nearby conductor. In other examples, the center frequency of the two-electrode BAW resonator cores 800 and 830 are used as a reference by grounding the bottom electrodes 802 and 832, shielding the bottom electrodes 802 and 832, or setting the bottom electrodes 802 and 832 to a voltage value based on a feedback loop (see e.g., FIGS. 3A-3C).

FIG. 9 shows a cross-sectional view of a three-electrode BAW resonator core 900 (e.g., the three-electrode BAW resonator core 642 in FIG. 6C) in accordance with various examples. The three-electrode BAW resonator core 900 in FIG. 9 is an example of an SMR that includes various layers formed over a semiconductor substrate 901. More specifically, the layers formed over the semiconductor substrate 901 include electro-active materials 910 (e.g., Bragg mirrors), a bottom electrode 902, electro-active materials 906A and 906B (e.g., piezoelectric materials), insulative layers 912A and 912B, top electrodes 904A and 904B, and electro-active materials 908A and 908B (e.g., Bragg mirrors). The three-electrode BAW resonator core 900 also includes a first metal node 932 that couples to the top electrode 904A, a second metal node 934 that couples to the other top electrode 904B, and a third metal node 930 that couples to the bottom electrode 902. In some examples, the metal node 930 corresponds to the control terminal 626 in FIG. 6C, the metal node 932 corresponds to the oscillator terminal 620 in FIG. 6C, and the metal node 934 corresponds to the oscillator terminal 628 in FIG. 6C. In other examples, the metal nodes 930, 932, 934 couple to external metal terminals (not shown) that facilitate coupling the three-electrode BAW resonator core 900 to other components (e.g., components of an oscillator unit).

In various examples, the substrate 901 is formed from silicon, the electro-active materials 910 include layers from different materials such as SiC, MSQ, SiO2, SiCOH, SiN, W, TiW, or Cu, and the bottom electrode 902 is formed from a metal such as W, Cu, Al, or Mo. In various examples, the electro-active materials 906A and 906B are formed from AlN or PZT, the insulative layers 912A and 912B are formed from an oxide material, the top electrodes 904A and 904B are formed from a metal such as W, Cu, Al, or Mo, and the electro-active materials 908A and 908B include layers from different materials such as SiC, MSQ, SiO2, SiCOH, SiN, W, TiW, or Cu.

In operation, the three-electrode BAW resonator core 900 has two active area 915A and 915B, where mechanical energy is confined and isolated. The active areas 915A and 915B are created by the various layers and applied signals. More specifically, the active area 915A occurs where there is overlap between the bottom electrode 902 and the top electrode 904A. Also, the active area 915B occurs where there is overlap between the bottom electrode 902 and the top electrode 904B. As shown, some of the layers used to create the active areas 915A and 915B are shared (e.g., the substrate 901, the electro-active materials 910, and the bottom electrode 902), while other layers are separated and are on opposite sides of the metal node 930 (e.g., mirrored from line 920). More specifically, the electro-active materials 906A, the top electrode 904A, and the electro-active materials 908A, are arranged to the left side of the metal node 930 and contribute to the active area 915A. Meanwhile, the electro-active materials 906B, the top electrode 904B, and the electro-active materials 908B, are arranged to the right side of the metal node 930, and contribute to the active area 915B.

When the bottom electrode 902 is positioned nearby a high-voltage conductor, the bottom electrode's voltage level is affected and the behavior of the active areas 915A and 915B is modified due to the effect of bottom electrode's voltage level on a physical characteristic (e.g., size, internal stress/strain, and/or shape) of one or more of the electro-active materials 910, 906A, 906B, 908A, and 908B. Accordingly, in some examples, the center frequency of the three-electrode BAW resonator core 900 is used to sense a voltage carried by a nearby conductor. In other examples, the center frequency of the three-electrode BAW resonator core 900 is used as a reference by grounding the bottom electrode 902, shielding the bottom electrode 902, or setting the bottom electrode 902 to a voltage value based on a feedback loop (see e.g., FIGS. 3A-3C).

In various examples, the tunable BAW resonator devices described herein are formed using SMR cores (e.g., the cores 800, 830, and 900 in FIGS. 8 and 9). In other examples, the tunable BAW resonator devices described herein are formed using film bulk acoustic resonator (FBAR) cores. FBARs are mechanical resonators formed from electro-active materials (e.g., piezoelectric materials) sandwiched between two metal electrodes. The main difference between FBAR and SMR is that FBARs employ a "released" structure, such that the electro-active materials and electrodes are freely suspended in space, with the help of some support beams or layers. FBARs have free boundary conditions at the outer surfaces of the electrodes as opposed to SMRs where the electrodes are part of a solid structure without air gaps.

Figure 10:
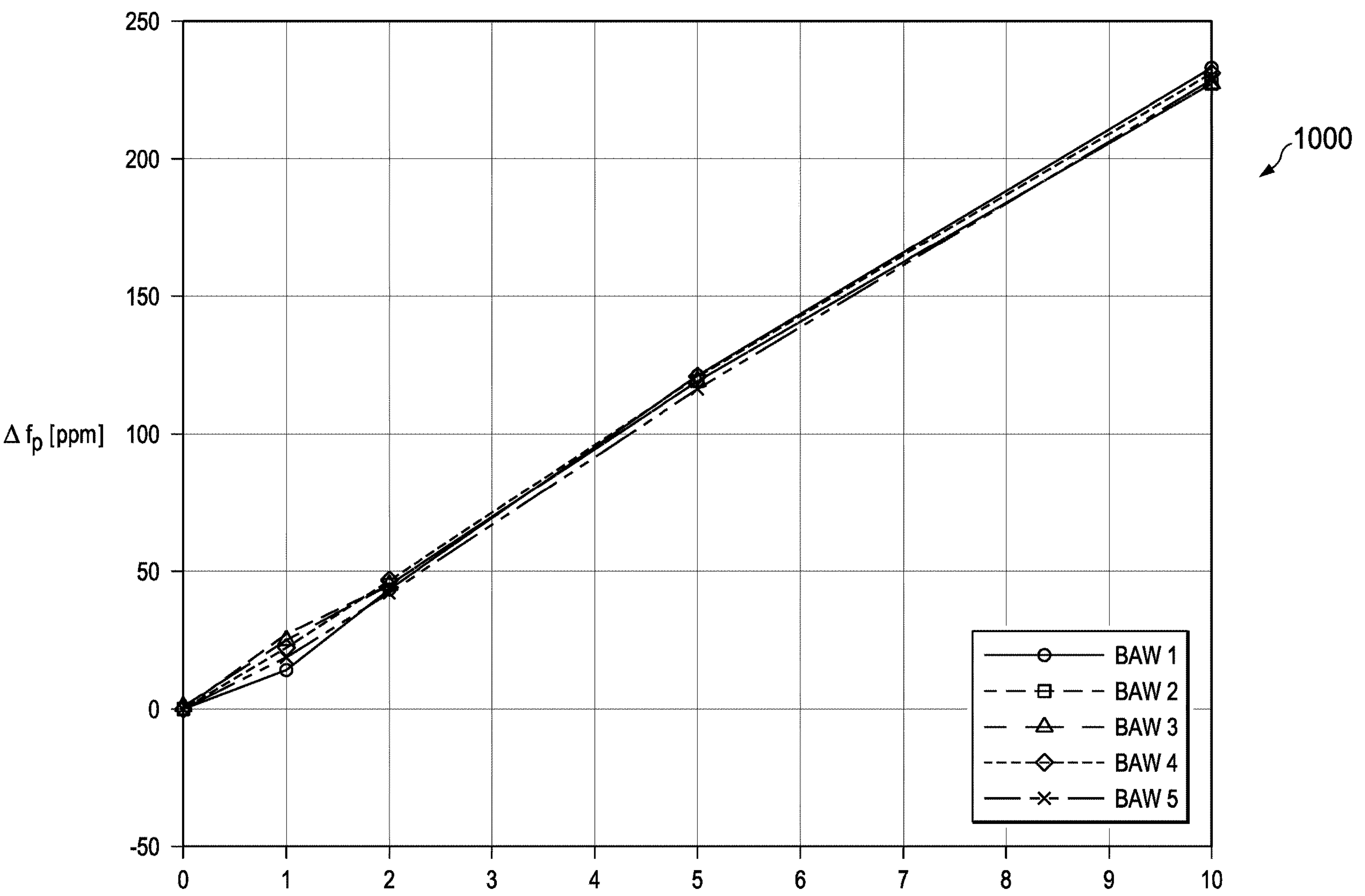
FIG. 10 shows a graph representing BAW resonator frequency shift as a function of a bias voltage being applied to a tunable BAW resonator device in accordance with various examples.

FIG. 10 shows a graph 1000 representing BAW resonator frequency shift as a function of a bias voltage being applied to a tunable BAW resonator device in accordance with various examples. As shown in graph 1000, adjusting a bias voltage (the voltage applied to a bottom electrode due to a nearby high-voltage conductor) by 2 volts changes a center frequency for each of multiple BAW resonators by approximately 50 ppm in a linear manner. The linear relationship between the bias voltage and center frequency shifts means tunable BAW resonator devices should have an expected range of frequency shift for a given bias voltage range. Thus, in different examples, tunable BAW resonator devices and related voltage sensor devices (e.g., devices 100A and 100B in FIGS. 1A and 1*b*) are made to support different voltage sensing ranges or sensitivities.

Figure 11:
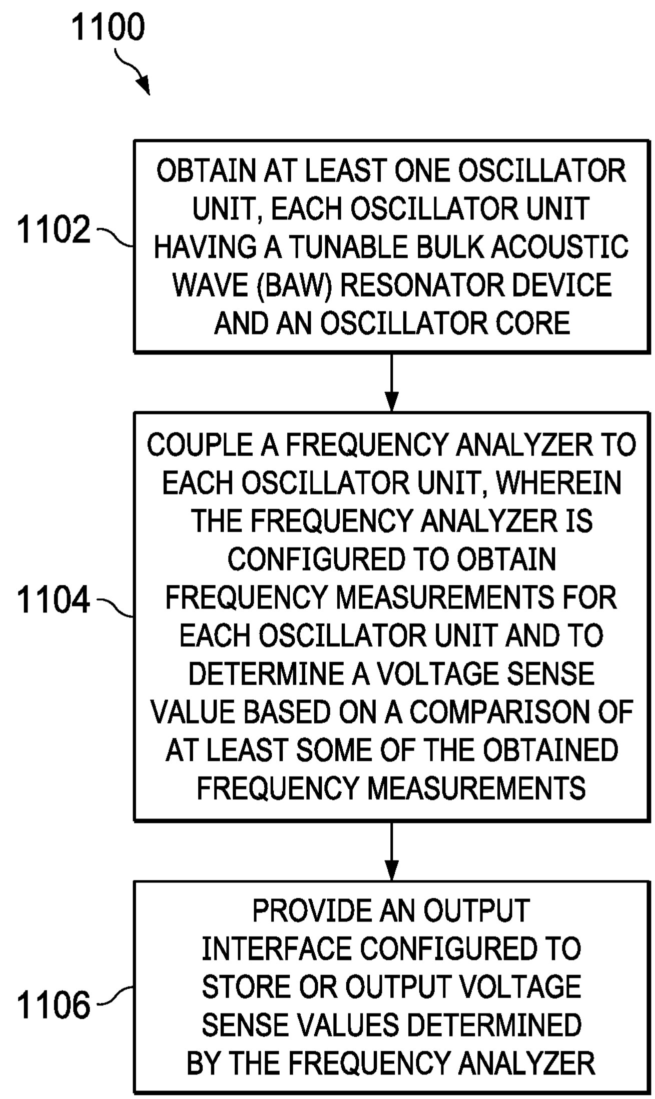
FIG. 11 shows a flowchart of a voltage sensor device fabrication method in accordance with various examples.

FIG. 11 shows a flowchart of a voltage sensor device fabrication method 1100 in accordance with various examples. As shown, the method 1100 comprises obtaining at least one oscillator unit, each oscillator unit having a tunable BAW resonator device and an oscillator core at block 1102. At block 1104, a frequency analyzer is coupled to each oscillator unit, wherein the frequency analyzer is configured to obtain frequency measurements for each oscillator unit and to determine a voltage sense value based on a comparison of at least some of the obtained frequency measurements. At block 1106, an output interface configured to store or output voltage sense values determined by the frequency analyzer is provided.

In some examples, the method 1100 also includes adding a dielectric sensing interface to each tunable BAW resonator device and/or adding a sensor attachment interface to each dielectric sensing interface. Further, in some examples, the method 1100 includes coupling a bottom electrode of a first tunable BAW resonator device to a ground node, and leaving a bottom electrode of a second tunable BAW resonator device as a floating electrode. Further, in some examples, the method 1100 includes adding a conductive element between a sensing surface and a first tunable BAW resonator device, coupling the conductive element to a ground node, and leaving a second tunable BAW resonator device unshielded relative to the sensing surface. Further, in some examples, the method 1100 includes adding a conductive element between a first tunable BAW resonator device and a second tunable BAW resonator device, and coupling the conductive element to a ground node. Further, in some examples, obtaining at least one oscillator unit, at block 1102, comprises forming a plurality of tunable BAW resonator cores on a single integrated circuit, and using each of the plurality of tunable BAW resonator cores with a respective oscillator unit.

In some examples, the method 1100 is used when fabricating a voltage sensor device (e.g., devices 100A or 100B of FIGS. 1A and 1B) with a tunable BAW resonator device that includes a pair of two-electrode BAW resonator cores (see e.g., device 600 or 630 of FIGS. 6A and 6B). In other examples, the method 1100 is used when fabricating a voltage sensor device (e.g., devices 100A or 100B of FIGS. 1A and 1B) with a tunable BAW resonator device that includes a tunable BAW resonator core (see e.g., device 650 FIG. 6C). It should be noted that, in different examples, the steps represented in method 1100 are performed in a different order and/or are performed simultaneously.

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Modifications are possible in the described embodiments, and other embodiments are possible, within the scope of the claims.

What is claimed is:

1. A voltage sensor, comprising: a first shield and a second shield disposed under a sensing surface, the first and second shield conductively connected to a ground terminal; a first oscillator having a first bulk acoustic wave (BAW) resonator and a first oscillator output, the first oscillator configured to provide at the first oscillator output a first signal that is shielded from effects of being proximate a sensing surface; a second oscillator having a second BAW resonator and a second oscillator output, the second oscillator configured to provide at the second oscillator output a second signal that is unshielded from effects of being proximate the sensing surface; a frequency analyzer having an analyzer output and first and second analyzer inputs, the first and second analyzer inputs respectively coupled to the first and second oscillator outputs, and the analyzer configured to compare the first and second signals and provide a voltage estimate at the analyzer output in response.

2. The voltage sensor of claim 1, including a dielectric sensing interface for the second BAW resonator.

3. The voltage sensor of claim 2, including a sensor attachment interface coupled to the dielectric sensing interface.

4. The voltage sensor of claim 1, wherein the first shield is between the first BAW resonator and the sensing surface.

5. The voltage sensor of claim 1, wherein the second shield is between the first and second BAW resonators to provide shielding between the first and second BAW resonators.

6. The voltage sensor of claim 1, wherein the first BAW resonator has a bottom electrode coupled to the ground terminal, and the second BAW resonator has an electrically floating bottom electrode.

7. The voltage sensor of claim 1, wherein the first BAW resonator has a bottom electrode that electrically floats.

8. The voltage sensor of claim 1, wherein the frequency analyzer includes two counters and compare logic configured to compare count values output by the counters, and the compare logic is configured to provide the voltage estimate.

9. The voltage sensor of claim 1, wherein the first and second oscillators are voltage sense oscillators, and the voltage sensor includes a reference oscillator and a feedback arrangement configured to adjust a reference oscillator frequency based on a frequency of the voltage sense oscillators.

10. The voltage sensor of claim 1, including a reference oscillator separate from the first and second oscillators, wherein the frequency analyzer is configured to obtain frequency measurements from the first and second oscillators and the reference oscillator to determine the voltage estimate.

11. The voltage sensor of claim 1, wherein the first and second BAW resonators are part of a single integrated circuit.

12. The voltage sensor of claim 1, wherein the first and second BAW resonators are part of different integrated circuits.

* * * * *